(12) United States Patent
Sanda et al.

(10) Patent No.: US 6,943,578 B1
(45) Date of Patent: Sep. 13, 2005

(54) METHOD AND APPLICATION OF PICA (PICOSECOND IMAGING CIRCUIT ANALYSIS) FOR HIGH CURRENT PULSED PHENOMENA

(75) Inventors: Naoko Pia Sanda, Chappaqua, NY (US); Steven H. Voldman, South Burlington, VT (US); Alan J. Weger, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/814,962

(22) Filed: Mar. 31, 2004

(51) Int. Cl.[7] .................. G01R 31/26; G01R 31/00; G06F 17/50
(52) U.S. Cl. .................. 324/765; 703/17; 702/117
(58) Field of Search .................. 324/500, 501, 324/512, 537, 764, 765, 752, 753; 702/57–59, 108, 117; 703/13–16, 23, 27, 28, 17

(56) References Cited

U.S. PATENT DOCUMENTS

| | | | |
|---|---|---|---|
| 5,256,882 A | 10/1993 | Miyasaka | 250/551 |
| 5,455,436 A | 10/1995 | Cheng | 257/356 |
| 5,517,207 A | 5/1996 | Kawada | 345/78 |
| 5,541,547 A | 7/1996 | Lam | 327/355 |
| 5,672,918 A | 9/1997 | Kimbrough | 307/126 |
| 5,736,777 A | 4/1998 | Shield | 257/529 |
| 5,841,293 A | 11/1998 | Leas | 324/765 |
| 5,940,545 A | 8/1999 | Kash | 382/312 |
| 6,172,512 B1 | 1/2001 | Evans | 324/752 |
| 6,228,726 B1 | 5/2001 | Liaw | 438/294 |
| 6,329,694 B1 | 12/2001 | Lee | 257/372 |
| 6,342,701 B1 | 1/2002 | Kash | 250/458.1 |
| 6,483,327 B1 | 11/2002 | Bruce | 324/752 |
| 6,507,057 B1 | 1/2003 | Ohno | 257/257 |
| 6,596,980 B2 * | 7/2003 | Rusu et al. | 250/214.1 |
| 6,608,494 B1 * | 8/2003 | Bruce et al. | 324/752 |
| 6,625,769 B1 | 9/2003 | Huott | 714/733 |
| 6,819,117 B2 * | 11/2004 | Wilsher | 324/601 |
| 2003/0146768 A1 | 8/2003 | Kash | 324/752 |
| 2003/0156750 A1 | 8/2003 | Dajee | 382/151 |

FOREIGN PATENT DOCUMENTS

| | | |
|---|---|---|
| JP | 05-160358 | 6/1993 |
| JP | 06-167534 | 6/1994 |
| JP | 20011284084 | 10/2001 |

OTHER PUBLICATIONS

Weger et al., "Transmission Line Pulse Picosecond Imaging Circuit Analysis Methodology for Evaluation of ESD and Lacthup", Mar. 30, 2004, 41st Annual 2003 IEEE International Reliability Physics Symposium Proceedings, pp. 99–104.*

* cited by examiner

*Primary Examiner*—Evan Pert
(74) *Attorney, Agent, or Firm*—Schmeiser, Olsen & Watts; William H. Steinberg

(57) ABSTRACT

A method, system and apparatus are provided for operating a Picosecond Imaging Circuit Analysis (PICA)/high current source system include applying pulses from a high current pulse source to a Device Under Test (DUT). A photosensor detects photon emissions from the DUT. Signals from the photosensor are used to map photon emissions from the DUT. Data processing means relate the photon emissions to specific features of the DUT.

30 Claims, 11 Drawing Sheets

METHOD AND APPLICATION OF PICA (PICOSECOND IMAGING CIRCUIT ANALYSIS) FOR HIGH CURRENT PULSED PHENOMENA

BACKGROUND OF THE INVENTION

1. Field of the Invention

The present invention relates to picosecond imaging circuit analysis in integrated circuits and, more particularly, to evaluation of latchup, ElectroStatic Discharge (ESD) and power bus robustness in computer chips.

Secondly, this invention relates to an apparatus and a method for a transmission line pulse picosecond imaging circuit analysis tool, and more particularly for characterization of pulsed voltage, current, and photon emissions in computer chips.

Thirdly, the present invention relates to the emulation of PICA (Picosecond Imaging Circuit Analysis) in integrated circuits from electrothermal circuit simulation, and more particularly, to evaluation of high current electrothermal phenomena in computer chips.

It is noted that the time scale for the optical measurement may be picoseconds or any other multiple thereof in accordance with this invention.

2. Description of the Related Art

As electronic components become smaller and smaller along with the internal structures in integrated circuits, the risk of either completely destroying or otherwise impairing electronic components from latchup increases. In particular, many integrated circuits are highly susceptible to latchup damage. Latchup, which involves a high current state leading to destructive or catastrophic damage, is typically understood as initiation of a PNPN structure, or silicon controlled rectifier (SCR) structure. The PNPN structure is intentionally designed, or is the result of a PNPN structure unintentionally formed between structures. Latchup can occur within peripheral circuits or internal circuits, within one circuit (intra-circuit) or between multiple circuits (inter-circuit). Latchup has become a critical problem for the electronics industry. Device failures are not always immediately catastrophic. Often the device is weakened only slightly, but is less able to withstand normal operating stresses, and that weakness may result in a reliability problem. Latchup is initiated by an equivalent circuit of a cross-coupled PNP and NPN transistor.

Regenerative feedback occurs between a PNP and an NPN transistor. With the base and collector regions being cross-coupled, current flows from one device leading to the initiation of the second. Such PNP and NPN elements can exist in any diffusions or implanted regions of other circuit elements (e.g. P-channel MOSFETs, N-channel MOSFETs, resistors, etc) or actual PNP and NPN bipolar transistors.

FIG. 1 illustrates a prior art CMOS FET device 7, which comprises a P– doped silicon substrate 18 in which an N–well 8 has been formed. An N+ doped contact region 10 and one of the source/drain P doped diffusion regions 12 are shown formed in the N–well. A P+ doped contact region 16 and one of the source/drain N+ diffusion regions 14 are shown formed in the P– doped substrate 18. The N+ doped contact region 10 is connected by line 10C to power supply voltage VDD and P+ doped contact region 16 is connected by line 16C to reference potential VSS. Line 12C is connected to P+ doped diffusion region 12 and line 14C is connected to the N+ doped diffusion region 14.

For example in a CMOS device, such as the device 7 in FIG. 1, an unwanted, parasitic PNPN structure is formed with a P– diffusion in the N–well 8 in the P– doped substrate 18. In the case of a parasitic PNPN, the N– well region 8 and the substrate region 18 are inherently involved in the latchup current exchange between regions. Latchup triggering conditions are a function of the current gain of the parasitic PNP and parasitic NPN bipolar transistors, and the resistance between the emitter and the base regions of those parasitic bipolar transistors. This inherently involves the N– well 8 and the substrate region 18. The latchup sensitivity is a function of spacings (e.g. base width of the parasitic NPN bipolar transistor and base width of the parasitic PNP bipolar transistor), current gain of the parasitic transistors, substrate resistance and spacings, and the well resistance and spacings. Isolation regions also play a role in the latchup sensitivity of a technology.

Latchup tolerance scaling is a function of the doping concentrations, and scaling characteristics of a technology. A common solution to reduce noise is to lower the well and substrate resistances.

In internal circuits and peripheral circuitry, latchup and noise are both a concern. Latchup and noise are initiated in the substrate from overshoot, and undershoot phenomena. These are generated by CMOS off-chip driver circuitry, receiver networks, and ESD devices. In CMOS I/O circuitry, undershoot and overshoot can lead to injection in the substrate. Hence, both a P– channel MOSFET and N– channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, overvoltage dielectric limiting circuitry, bleed resistors, keeper networks and other elements can lead to injection into the substrate. ESD elements connected to the input pad can also lead to noise injection and latchup. ESD elements that can lead to noise injection, and latchup include MOSFETs, PNPN SCR, ESD structures, P+/N– well diodes, N–well to substrate diodes, N+ diffusion diodes, and other ESD circuits. ESD circuits can contribute to noise injection into the substrate and latchup.

With the growth of the high-speed data rate transmission, optical interconnect, wireless and wired marketplaces, the breadth of mixed signal and radio frequency (RF) applications and requirements is broad. Each type of application space has a wide range of power supply conditions, a number of independent power domains, and circuit performance objectives. Different power domains are established between digital, analog and radio frequency (RF) functional blocks on an integrated chip. With System-On-a-Chip (SOC), different circuit and system functions are integrated into a common chip substrate.

Latchup leads to interaction of the ESD network, the I/O circuit, and the power bus as well as the chip substrate and architecture. Latchup is initiated or triggered by the ESD element, or the I/O circuit. When it occurs, the failure process, temporally, is not observed and it is not clear what is the current path, what is the process of initiation and what are the elements involved. For ESD networks, it is not clear what is the mode of operation and what is the response as the current is increased. Again, in observing ESD failures it is hard to tell after failure of whether the ESD or the I/O circuit failed first. Again, having analysis in a time domain would allow visualization of the failure process.

For RF applications in RF CMOS, BiCMOS, BiCMOS SiGe and analog applications, that become oscillatory as the RF signal increases, failure of the RF circuits and ESD, can destroy elements. With respect to RF signal levels which can destroy circuits, knowledge of the positive or negative oscillation peaks will allow understanding how the RF circuit fails. Using the photon emission evaluation process, an element that is leading to failure can be identified.

For analysis of semiconductor failure mechanisms and evaluation of the optical sources, it is valuable for us to distinguish whether structures are in forward or reverse bias and whether the structures are generating low electric field and high electric fields. This is important for understanding the recombination emissions from those of avalanche phenomena.

High current pulse testing is valuable for evaluation of electronic components under a pulsed mode. For the evaluation of the current and voltage, a system is needed that is capable of capturing the current, and voltage of the component. Hence it is important for a test system to be able to measure the voltage and current to provide an understanding of the voltage and current under pulsed conditions. Measurements of the pulsed voltage and current can provide the terminal currents in a device.

Photons are emitted from the structures. Analysis of the spatial density and time evolution of the photon emission allows for the understanding of how the current distributes in the structure. Photon emissions using a DC voltage source provides a DC method of determining the photon emissions.

PICA (Picosecond Imaging Circuit Analysis) has been previously used to observe the switching activities of CMOS circuits and is described in U.S. Pat. No. 5,940,545 entitled, "Noninvasive Optical Method for Measuring Internal Switching and Other Dynamic Parameters of CMOS Circuits", and is herein incorporated by reference. A test system and method that can provide the pulsed voltage, current, and PICA for photo emission mapping temporally in space and time will allow for a high current pulse method that is utilized for electronic components.

SUMMARY OF THE INVENTION

A new tool has been developed for evaluation of photon emissions from high current phenomena using a pulse train of high current into an unpowered chip. The motivation of this was to evaluate high current phenomena such as latchup, ESD, or other high current issues.

This tool shows the emission in space and time by providing a visual capability to visualize the photon emission. This new tool has the ability to watch the emissions in space and time and determine faults, failure and triggering of undesired states.

A difficulty with this method is that the emissions are not intuitive, and a means to emulate this capability with circuit simulation would be valuable.

Hence the invention is defined to provide a means to emulate the photon emission visual mapping to allow predictive as well as intuitive interpretations of the photon emission signals demonstrated from the transient photon emission tool.

It is an object of the present invention to provide a method, which improves the latchup tolerance and allows for the evaluation of latchup in a temporal process.

Another object of the invention is to provide a method, which evaluates the transient latchup tolerance and allows for the evaluation of latchup dynamically.

It is still another object of the present invention to provide a method, which evaluates the ESD robustness and allows for the evaluation of ESD device response as a function of increased current level.

It is a further object of the present invention to provide a method, which evaluates the power bus and ground robustness and allows for the evaluation of power bus design weaknesses as a function of increased current level.

It is still a further object of the present invention to provide a method, which evaluates the RF power-to-failure.

The present invention provides structures, methods and apparatus for evaluation of latchup protection, ESD, power bus and substrate distribution and the interaction of these in time for dynamic pulses, or A.C. variation. This method and apparatus addresses the co-synthesis of an improved latchup tolerant circuits and a noise reduction system.

It is an object of the present invention to provide an apparatus and a method which allows for the measurement of the current, voltage, and photon emission intensity and spatial distribution for time varying signals.

It is an object of the present invention to provide an apparatus and a method for measurement of the current, voltage, and photon emission intensity and spatial distribution for pulsed phenomena.

The present invention provides structures, methods and apparatus for evaluation of current, voltage and photon emission distribution.

An object of the present invention is to provide a method that predicts photon emission from device simulation to provide a photo-mapping in space and time.

It is an another object of the present invention to provide a method, which predicts photon emissions from an electrothermal device simulation to provide a photo-mapping in space and time as well as address the self-heating and thermal effects in the circuits, and chip substrate.

Still another object of the present invention is to provide a method which predicts photon emissions from an electrothermal device simulation to provide a photo-mapping in space and time which emulates a transient picosecond imaging circuit analysis tool mapping in space and time to compare the simulated emission map to the actual emission map.

It is an object of the present invention to provide a reverse method which predicts current and voltage values associated with structures from a transient picosecond imaging circuit analysis tool by means of identification of the emission and predict current and voltage conditions in a circuit or semiconductor chip.

One more object of the present invention is to provide a reverse method, which predicts current and voltage values associated with structures from a transient picosecond imaging circuit analysis tool by means of identification of the emission and predict current and voltage conditions in a circuit or semiconductor chip wherein the mapping is compared to results on an electrothermal simulation tool.

An object of the present invention is to provide a method, which utilizes Photon Emission Microscopy (PEM) to extract the electrical states at high current.

Finally, an object of the present invention is to provide a method, which allows for experimental distinguishing of radiative recombination of electron hole pairs and the relaxation of hot electrons generated in the high field regions using optical filtering.

In accordance with this invention, a method is provided for operating a Picosecond Imaging Circuit Analysis (PICA)/high current source system. The method comprises applying pulses from a high current pulse source to a Device Under Test (DUT); employing a photosensor means for detecting photon emissions from the DUT; receiving signals from the photosensor means to map photon emissions from the DUT; and employing data processing means for relating the photon emissions to specific features of the DUT. Preferably the method includes employing high current source means to generate a pulse train which increases in amplitude with time; and the pulse train is periodic or aperiodic. Preferably, the pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged cable Discharge Event (CDE), and a Transmission Line Pulse (TLP).

Preferably, the method comprises the following steps. Provide a current probe to measure current in the DUT. Provide a voltage probe to measure voltage in the DUT. Provide a leakage measurement means for evaluation of a device. Provide a photon collection process in time from the device. Provide a step increase in the high current pulse source amplitude after adequate emission data is established. Provide a Computer Aided Design (CAD) system to visualize the emissions on the chip mapping. Provide a means to store voltage, current, leakage and photon emissions from the device. Provide an averaging means of voltage, current, leakage, and photon measure. Provide a means of visualization of a photon intensity spatially. Provide a means to plot voltage, current, leakage an a measure of photon emissions from the device, whereby high current pulse and photon emission analysis is provided.

In accordance with another aspect of this invention, a method is provided for evaluation of photon emissions and high current robustness of a semiconductor chip comprising the following steps. Provide electrical signals to pads of the semiconductor chip. Eliminate power supply D.C. voltage levels to the chip to set the chip into an unpowered state. Provide a pulse train source producing pulses with a fixed pulse width and fixed rise and fall times for a pre-determined pulse current magnitude into the pads of the semiconductor chip. Provide filtered light emissions by filtering light emissions of a first frequency range from the semiconductor chip. Collect the filtered light emissions and determining an adequate number of pulses to provide adequate signal magnitude for analysis. Evaluate the functionality of the semiconductor chip to evaluate parametric shifts or destruction. Increase the current magnitude of the pulse train and repeat the aforementioned steps until destruction of the semiconductor chip, and repeat all the above steps with a second filter frequency range. Preferably, the pulse train source provides pulses with a plurality of pulse widths; the pulse train source provides pulses with a plurality of pulse rise times; a filter is used to determine electron-hole pair recombination; and the filter is used to determine avalanche breakdown; and the filters are rg780 and bg39.

In accordance with a further aspect of this invention, the method provides a picosecond imaging circuit analysis/high current source system and emulator by the following steps. Provide a high current pulse source. Provide a photon collection process in time. Provide a step increase in the high current pulse source amplitude after adequate emission data is established. Provide a Computer Aided Design CAD) system to visualize the emissions on the chip mapping. Provide an electro-thermal circuit simulation. Provide a post-processor to generate the photon emission rate. Provide an emulated mapping of the photon collection process in time; and provide a comparator between the actual photon mapping and the emulated photon mapping.

In accordance with yet another aspect of this invention a computer program product is provided comprising a computer useable medium having computer readable program code embodied therein for operating a to picosecond imaging circuit analysis/high current source system. The program product includes as follows:
 a) program code configured to provide a high current pulse source;
 b) program code configured to employ a photosensor means for detecting photon emissions from a device under test;
 c) program code configured for receiving signals from said photosensor means to map photon emissions from said DUT; and
 d) program code configured for employing data processing means for relating said photon emissions to specific features of said DUT.

Preferably, program codes are configured to operate high current source means for generating a pulse train which increases in amplitude with time; the program codes configured to the pulse train are periodic or aperiodic. Preferably the computer program product includes program code configured whereby the pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged cable Discharge Event (CDE), and a Transmission Line Pulse (TLP).

In accordance with a different aspect of this invention, a picosecond imaging circuit analysis/high current source analysis apparatus is provided including the following features. A high current source means is provided for applying a pulse to a Device Under Test (DUT). A photosensor means detects photon emissions from a DUT. A data acquisition circuit receives signals from the photosensor means for mapping a photon emissions from the DUT. Data processing means is connected to the data acquisition circuit for relating the photon emissions to specific features of the DUT. Preferably the high current source means generates a pulse train which increases in amplitude with time; the pulse train is periodic or aperiodic. Preferably, the pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged cable Discharge Event (CDE), and a Transmission Line Pulse (TLP); and an algorithm is provided to relate the photon emission to the power to failure.

In accordance with another aspect of this invention a high current pulse electrical and picosecond imaging circuit analysis apparatus is provided which includes a pulse source, a transmission line cable from the the pulse source to a structure with a high voltage switch connected in the transmission line cable, an oscilloscope, a current probe, a voltage probe, a leakage measurement source, photo-detector array, a data-acquisition system connected for collecting data from the photo-detector array and data including oscilloscope voltage and current signals, leakage measurements, and means for providing visualization of photon emissions in time.

An alternative apparatus in accordance with this invention is provided to emulate a picosecond imaging circuit analysis/high current source analysis apparatus. The high current source forms a pulse train. A collection source evaluates photon emissions. A computer aided design (CAD) system is provided for visualizing chip mapping. An electro thermal circuit simulator, a post-processing system for calculating photon emission from a circuit simulator, and a second computer aided design (CAD) system for visualizing emulated photon emissions from the post-processing system are also provided. Preferably, a comparator system is provided which compares an actual photon emission map from the first computer aided design (CAD) system from the photon emissions, and from the second computer aided design (CAD) system from an emulated photon emission map. Preferably, the system provides a filter for emission energy for the first and the second CAD systems; the system provides a filter for emission energy for the first and the second CAD systems; and a third CAD system provides the means to calculate current and voltage on a given node from the photon emission mapping whose results are compared to the electrothermal circuit simulation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTIONS OF PREFERRED EMBODIMENTS OF THE INVENTION

Figure 2:
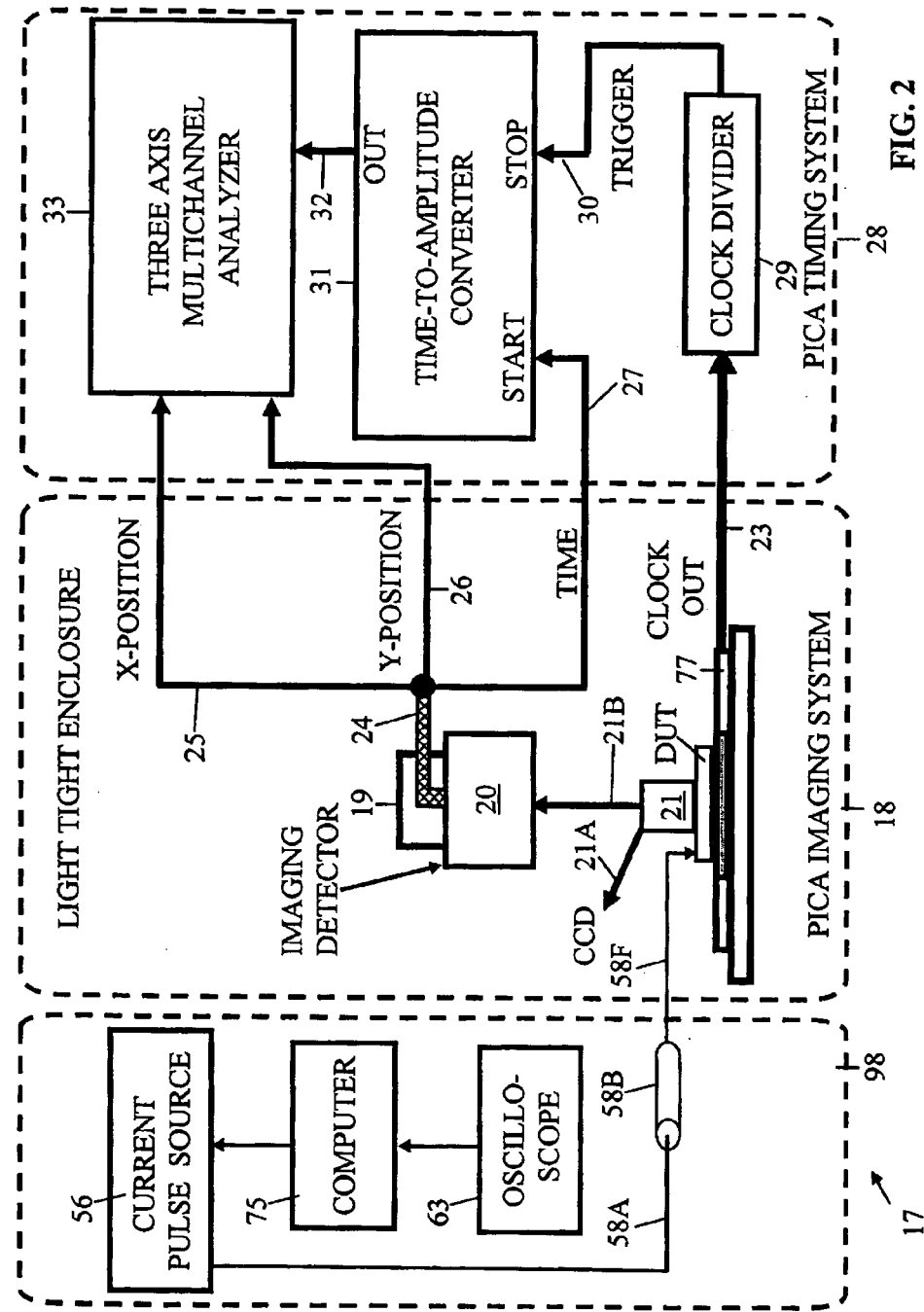
FIG. 2 is a schematic/block diagram is showing a PICA (Picosecond Imaging Circuit Analysis) tool to which a Transmission Line Pulse (TLP) is supplied in a representative environment on which the subject invention may be implemented in accordance with this invention.

Referring now to the drawings, and more particularly to FIG. 2, a schematic/block diagram is shown of a system 17 including a PICA (Picosecond Imaging Circuit Analysis) tool to which a Transmission Line Pulse (TLP) is supplied in a representative environment on which the subject invention may be implemented in accordance with this invention. The Picosecond Imaging Circuit Analysis (PICA) system 17 includes a PICA imaging system 18 and a PICA timing system 28. A device under test DUT is being examined by the system 17 to achieve evaluation of the latchup condition thereof. The DUT comprises an integrated circuit chip device which is initially in a powered state. A high current pulse source 56 is used, which allows increases in the pulse train magnitude with time. Three tests are evaluated in the process. Those tests relate to the power grid, to the substrate and to the signal pins. The pulse magnitude starts at a low magnitude below the native power supply voltage level.

This system shown in FIG. 2 includes a pulse source 98 including an oscilloscope 63 which provides and input to a computer 75 which provides an input to a high current pulse source 56. The high current pulse source 56 comprises a programmable pulse source having an output connected through a transmission line cable 58A and a first fixed impedance charged transmission line 58B, and transmission line cable 58F to the Device Under Test which as an example is a semiconductor chip DUT. The Transmission Line Pulse (TLP) line cable 58F provides a pulse waveform train to the device DUT. The device DUT is housed in a light tight enclosure 18. The high current pulse source 56 is a preferably a commercial pulse source which allows for defining the pulse characteristics. These are the rise time, fall time, width, and repetition rate of the pulses. The source is a single pulse source whose firing of consecutive pulses is provided by the computer system 75. Alternatively, the firing timing can be provided by the source itself.

Radiation from the device DUT is focused onto a lense 21 onto an imaging detector 19 which has both spatial and time resolution. Hence, as the device DUT undergoes current emissions, the photon intensity is obtained at any time during the applied voltage and current. Since the device DUT is electrically isolated from the voltage and current, the photon emissions are observed during the complete length of the applied pulse and after the pulse, allowing for evaluation of photon emissions after the pulse event has occured. Line 23 from a stage 77 supporting the device DUT passes a clock output signal to a clock divider 29 in the PICA timing system 28.

The lense element 21 passes light through 21B to the imaging detector 20 which has an output 19 through which cable 24 delivers x-position data output on line 25, y-position data output on line 26 and time data on line 27 to the PICA timing system 28. The x-position signal on line 25 and the y position signal on line 26 pass to inputs to a Three (3) axis multichannel analyzer 33. The time signal on line 27 passes to the START input of the Time-to-Amplitude Converter (TAC) 31. The output of the clock divider 29 passes via line 30 to trigger the STOP input of the TAC 31. The TAC 31 provides an output on line 32 to the three-axis multichannel analyzer 33.

As in the case of the voltage and current measurement window process, the photon emissions are stored only within that specific window of time. One method to define the photon emissions within the measurement window time, a time averaged photon density is obtained for a given position. When it is of interest to store all the photon emissions during the event, or even a different "photon measurement window", the photon emissions are then stored with the information of the current and voltage of the device in the data acquisition system.

In the method in this invention, if the evaluation of the leakage exceeds a leakage failure criteria, testing is discontinued. In this method, if it is of interest to evaluate past a leakage increase, the testing can continue to study beyond a failure criterion that is established. With this pulse waveform, a pulse train of successive pulses is applied continuously, repeating the charging process, switch closures, application of current to the device DUT, and the measurement of the current, voltage and photon emission level information, and leakage. With this method, the average current, voltage and photon emissions are collected. Given low photon count signals, the repeated tests allow acquisition of more signals for the photon count and intensity in space. The total or average photon intensity, or peak intensity can be of interest to the user. After adequate pulses, either single or multiple, applied to the device DUT, the process can continue by incrementally increasing the charging source or pulse source to increase the charge on the source to increase the applied current at the device DUT. The sequence is then repeated of measuring voltage, current, photon emissions and leakage ad infinitum. In this method, the pulse width, rise time, or any other variable of interest is altered.

In the case of increasing the pulse source magnitude, an I-V characteristic plot is shown where the measurement window average voltage and current is plotted on the plot. Additionally, a plot of photon count versus either the measurement window averaged current or voltage is plotted. The photon count is total photon count, average photon count within the voltage/current measurement window, an average or total photon count within another measurement window criterion, or the peak intensity at any point in the 2-D array mapping. Additionally, the leakage measurement is plotted along with the current, voltage, or photon measurements for each successive point. Again this is relevant to the single pulse or the repeated pulse train results. In the case of the pulse train, the leakage measurement is taken after a single pulse or a series of pulses from the pulse train.

Figure 1:
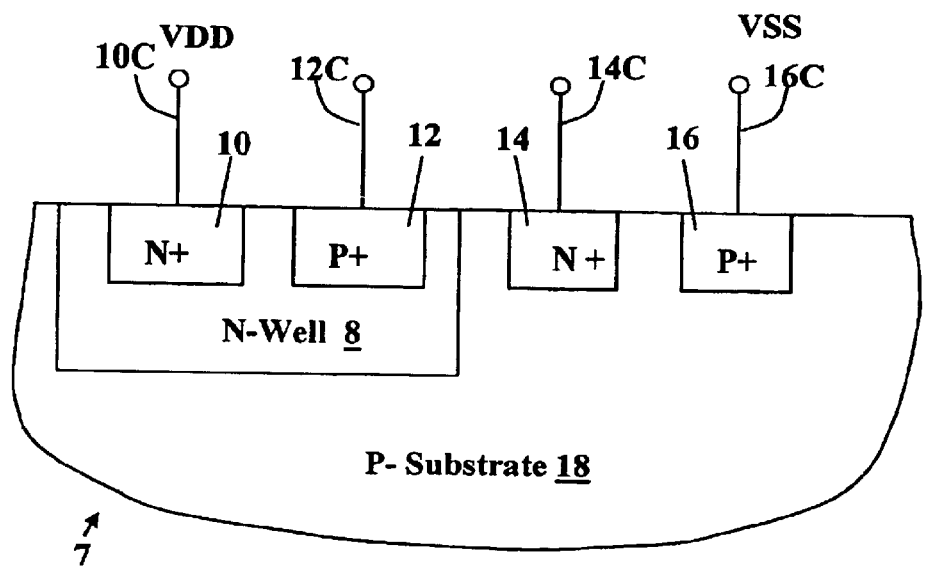
FIG. 1 partially shows a prior art CMOS FET device which comprises a P– doped silicon substrate in which an N-well has been formed.
Figure 3:
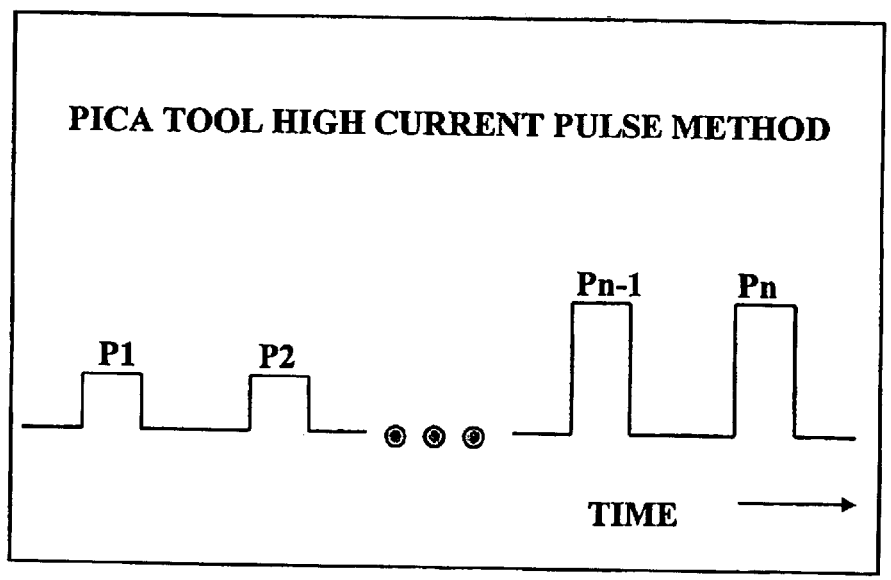
FIG. 3 illustrates how the PICA high current pulse testing method of this invention can produce a series of pulses for evaluation of electronic components under a pulsed mode whereby the first two pulses P1 and P2 have a low amplitude and subsequent pulses Pn–1 and Pn which are the last in a series of pulses have a maximum amplitude.

FIG. 3 illustrates how the PICA high current pulse testing method can produce a series of pulses for evaluation of electronic components under a pulsed mode whereby the first two pulses P1 and P2 have a low amplitude and subsequent pulses Pn−1 and Pn which are the last in a series of pulses have a maximum amplitude.

Figure 4:
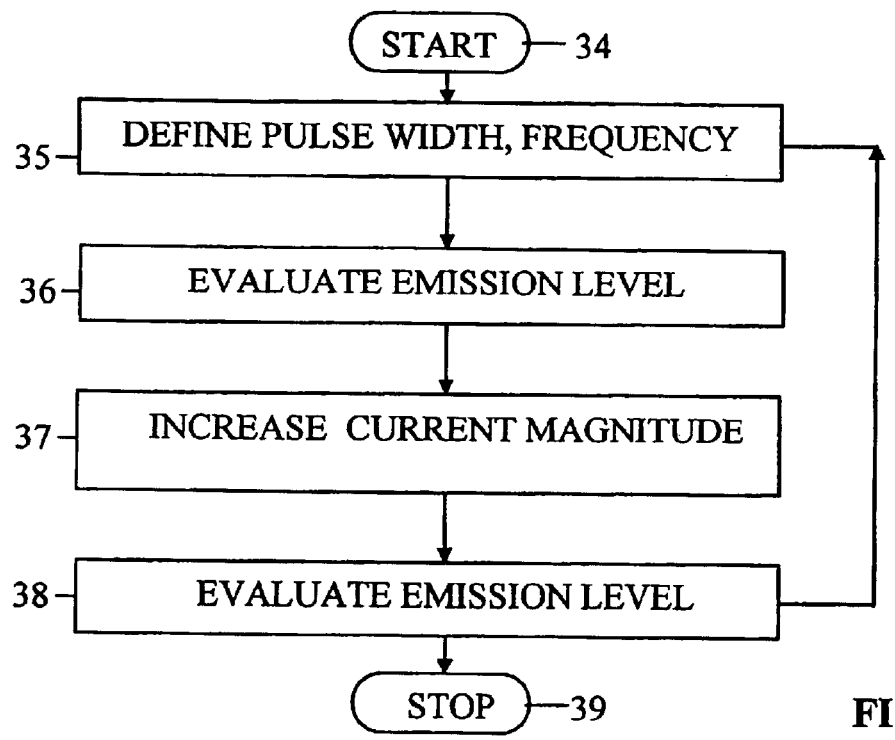
FIG. 4 is a flow chart of a program for the PICA high current pulse testing method employed in a testing system.

FIG. 4 is a flow chart of a program for the PICA high current pulse testing method employed in a testing system. The program begins at step 34 which starts the program. Next in step 35 the system defines pulse width and pulse frequency. In step 36, the emission level is evaluated. In step 37, the current magnitude is increased and finally in step 38, the emission level from the device DUT is evaluated. The program ends at STOP step 39.

Figure 5:
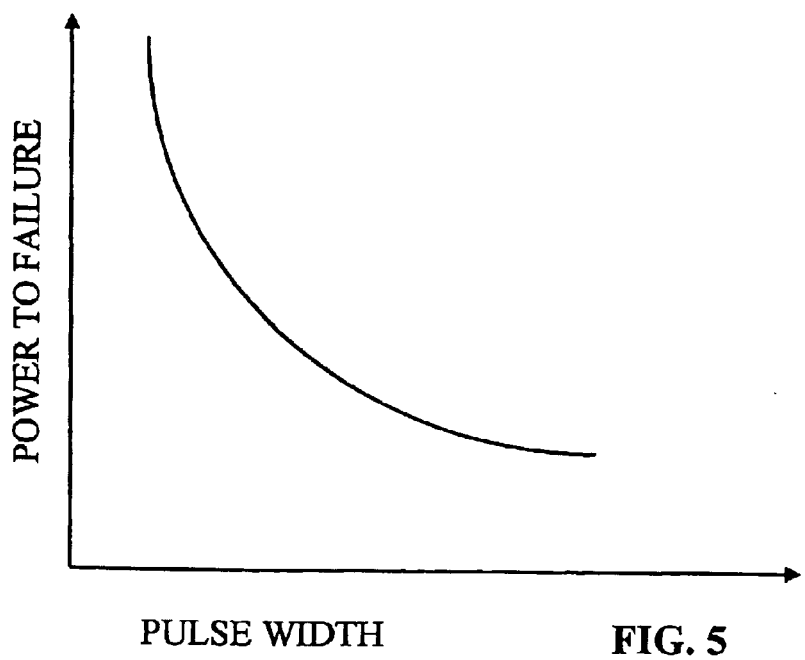
FIG. 5 is a chart showing that the power to failure decreases exponentially as a function of increasing pulse width.

FIG. 5 is a chart showing that the power to failure decreases exponentially as a function of increasing pulse width, i.e. a lower power pulse with greater width can cause failure, as easily as a pulse with a shorter width but a higher power.

Method

Figure 6:
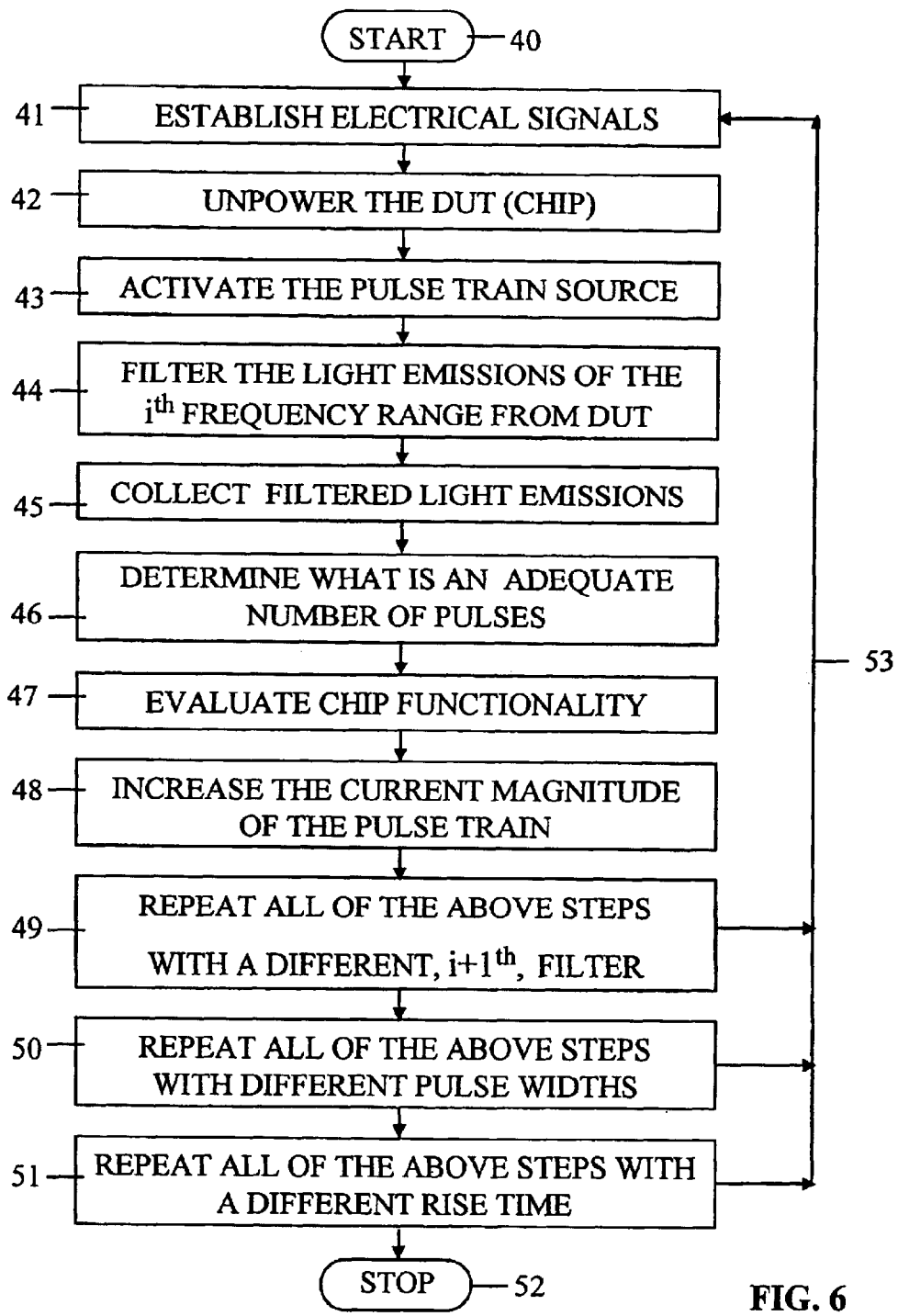
FIG. 6 shows a flow chart for a control computer or system for the PICA high current pulse testing method comprising a series of steps employed in accordance with the method of this invention.

FIG. 6 shows a flow chart for a control computer or system for the PICA high current pulse testing method comprising a series of steps employed in accordance with this invention. The PICA high current pulse testing method begins at START in step 40. The method of FIG. 6 can be performed using the apparatus of FIG. 7A for achievement of the objective of this invention.

The method of FIG. 6 begins at START 40, that leads to step 41. In step 41, establish electrical signals to the semiconductor chip device DUT in FIGS. 2 and 7A. Next in step 42, the system eliminates power supply D.C. voltage levels to set the semiconductor chip device DUT into an unpowered state. Then in step 43, the system activates a pulse train source to generate a series of PICA high current pulses of a fixed pulse width and fixed rise and fall times for a predetermined pulse magnitude into pads of the semiconductor chip device DUT in FIG. 7A. In step 44, filter light emissions of the $i^{th}$ (first) frequency (wavelength) range from the semiconductor chip device DUT. In step 45, the system provides for collection of the filtered light emissions from the chip device DUT. In step 46, determine an adequate number of pulses to provide an adequate signal magnitude for analysis. In step 47, evaluate the functionality of the semiconductor chip device DUT to evaluate parametric shifts or destruction. In step 48, increase the current magnitude of the pulse train and repeat the aforementioned steps in the process until destruction of the semiconductor chip device DUT occurs. In step 49, in a primary recursive sequence, repeat all the above steps in the aforementioned process with an $i+1^{th}$ (second) filter frequency range, as indicated by line 53 back to step 41. In step 50, in a secondary recursive sequence, repeat all the above steps for a plurality of semiconductor chips device DUT with a different pulse widths, as indicated by line 53 back to step 41. In step 51, in a tertiary recursive sequence, repeat all the above steps for a plurality of semiconductor chips device DUT with a different rise time, as indicated by line 53 back to step 41. In step 52, the process illustrated by FIG. 6 ends. The process continues until a certain level of failure criteria is met, i.e. no nondestructive level, e.g. latchup. The criteria for ending the recursive repetition of the process on line 53 are 1) fixed point; 2) failure criteria level; and 3) destruction.

Figure 7A:
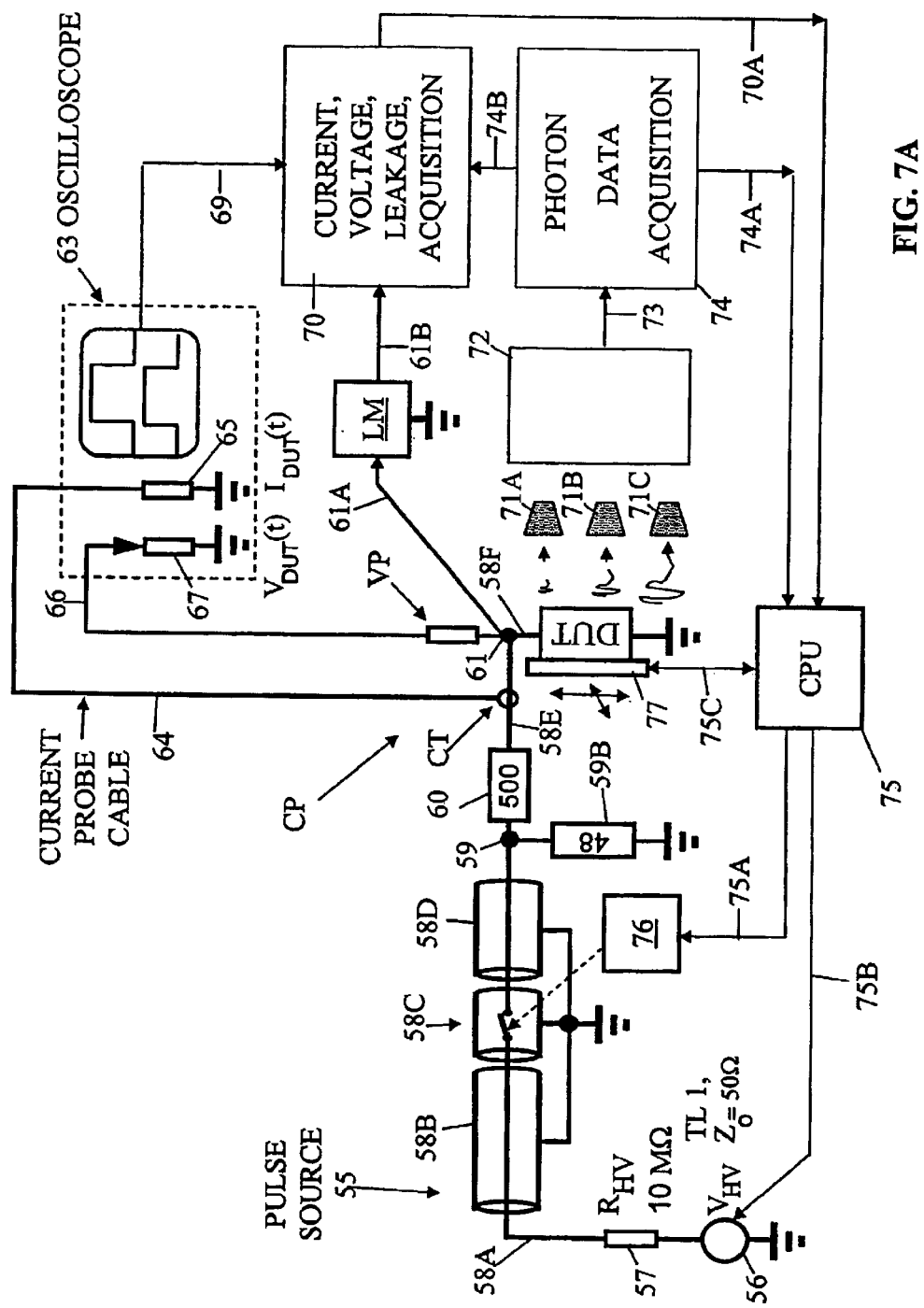
FIG. 7A is a block diagram illustrating another embodiment of a PICA (Picosecond Imaging Circuit Analysis) tool to which a Transmission Line Pulse (TLP) is supplied in a representative environment on which the subject invention may be may be practiced on a Device Under Test (DUT) in accordance with the present invention.

FIG. 7A is a schematic block diagram of a high-current pulse picosecond imaging circuit analysis tool and system in accordance with the method of the present invention. The apparatus of FIG. 7A provides a representative environment in which the method of the subject invention may be implemented. The picosecond imaging circuit analysis tool and system are used in a unique fashion to provide these capabilities.

To achieve evaluation of the latchup condition, an integrated circuit chip device DUT is operated in a powered state. A high current pulse generator 55 is used, which allows increases in the magnitude with time of a pulse train applied to the DUT. Three tests are evaluated in the process. Those tests relate to the power grid, to the substrate and to the signal pins. The pulse magnitude starts at a low magnitude below the native power supply voltage level.

This system shown in FIG. 7A consists of a pulse source 55 including a high current pulse source 56, e.g. a Hewlett Packard HP8814A which is a programmable pulse source employed as a current pulse generator. High current pulse source 56 has an output connected through a high impedance resistor $R_{HV}$. The output of the high impedance resistor $R_{HV}$ is connected to transmission line cable 58A–58D which includes a first fixed impedance charged transmission line 58B, a high voltage electro-mechanical switch 58C, and a second fixed impedance charged transmission line 58D which connects to node 59, e.g. time domain transmission known in ESD (ElectroStatic Discharge) technology to provide such a source.

The high voltage switch 58C is included between transmission line cable section 58B and transmission line cable section 58D, so the cable transmission line segments 58B and 58D are connected through the high voltage switch 58C, which is opened and closed by a transducer 76. Alternatively, a high voltage electrical switch such as a mercury vapor discharge switch can be employed.

Pulses generated by opening and closing of the high voltage switch 58C pass through cable 58D and through node 58 where there is a termination of a 48 ohm resistor connected to ground and a 500 ohm resistor 60 which connects through conductor 58E to node 61 which connects to the the input connection to the device under test device DUT and to a voltage probe VP. Voltage probe VP connects through line 66 to the voltage input of an oscilloscope 63. In other words, an attenuator is provided by resistor 59B with an resistance of 48 ohms from node 59 to ground and resistor 60 with an resistance of 500 ohms in series from node 59 line 58E which connects to node 61. Rise time filters are provided to address overshoot to provide cleaner pulse waveforms. Alternative configurations of Transmission Line Pulse (TLP) apparatus are known in the art which are adapted to providing a pulse waveform train.

A current transformer CT is inductively coupled to the transmission line 58E near node 61. The current transformer CT is a part of a current probe CP that also includes a current probe cable 64 which connects current measurements from the current transformer CT to the current input 65 of the oscilloscope 63. An electro-magnetic current probe CP such as a TEK CT-1 has its current transformer CT placed around the pulsed signal line to capture the current signal in time as the device DUT supported on stage 77 is being pulsed which is then sent through current probe cable 64 to current input 65 to an oscilloscope 63.

Optical radiation emitted from the DUT passes through several optical filters 71A–71C, which pass various ranges of optical frequencies (wavelengths) to a photo-multiplier detector array 72, the output of which passes to a photon data acquisition block 74 which provides an output to a central computer CPU on line 70A and on line 74B to a Current Voltage, Leakage Acquisition (CVLA) unit 70. The CVLA unit 70 also receives an input on line 69 from the oscilloscope 63. The output of the CVLA unit 70 on line 70A provides inputs to the CPU comprising AC or RF characteristics or other parametric values for analysis of failure criteria which can be used, e.g. R.F. characterization and other parameters can be extracted across the DUT. Other types of electrical measurements across the DUT are achievable instead of leakage measurements.

The computer (CPU) 75 is connected to receive outputs from the photon data acquisition block 74 on line 74A and from the CBLA 70 on line 70A. CPU 75 supplies inputs to the transducer 76 and the high current pulse, charging source 56. The CPU 75 is connected to the stage 77 to send and positioning data thereto and to receive positioning data therefrom. A leakage measurement source which can be employed is a Keithley instruments tool. An attenuator and a Rise time filter can be employed as defined by ESD Association Standard Practice Documents on Transmission Line Pulse Measuring.

The high current pulsed picosecond imaging circuit analysing system shown in FIG. 7A illustrates the integration with the present environment within which the present invention can be practiced.

The pulse source 55 is a preferably a commercial pulse source which allows for defining the pulse characteristics. These pulse characteristics are the rise time, fall time, width, and repetition rate of the pulses. The pulse source 55 is a single pulse source whose firing of consecutive pulses is provided by signals from the computer system 75, or as a function of the pulse source 55 itself. Commercial sources with programming functions are used.

For non-commercial sources, pulse source 55 can consist of a transmission line cable 58B/58D, a charging source 56, a high impedance resistor 57 to charge the transmission line cable 58B/58D, electrical switches 58C to isolate the charging source 56, and a software programming function as described above with reference to FIG. 6. In the case of the transmission line source, the transmission line must be isolated from the device DUT to allow for charging of the transmission line cable without voltage being applied to the device DUT. Hence an electrical switch 58C is required to allow the charging source to supply the current required between closures thereof.

Figure 7B:
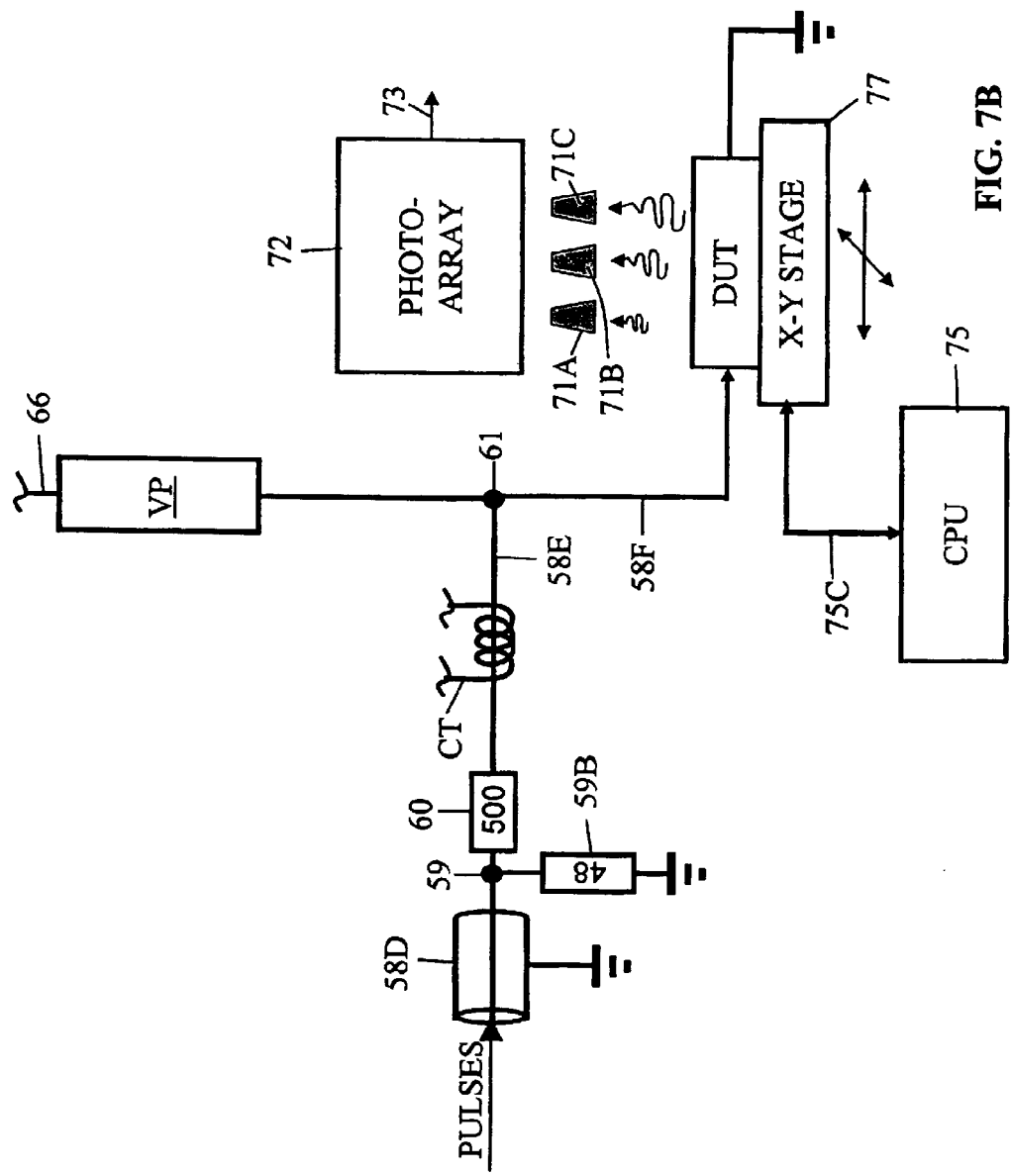
FIG. 7B is a block diagram that shows a portion of the system of FIG. 7A wherein pulses are supplied to a transmission line passing through a node, a line and another node that connects to a Voltage Probe and through a third line to a DUT with a current transformer wrapped about the second line to measure the current flowing to the DUT.

Referring to FIG. 7B, a pulse is supplied to the transmission line 58D which passes through a focusing lense and node 59 and through line 58E to node 61, which connects to the Voltage Probe VP and through the line 58F to the device DUT. The current transformer CT is shown wrapped about the line 58E to measure the current flowing therethrough to the device DUT.

When a pulse current is applied at node 61 to the device DUT allowing the current to flow through the structure, the current probe CP captures the current signal at the time that the device DUT is being pulsed . Various alternative methods are available to capture the voltage and current across the device DUT using resistor elements or other means, as will be understood by those skilled in the art.

As explained above, a pulse is applied to the device DUT, where the voltage and current signals are captured by the current and/or voltage probes. The resultant signal is stored in the oscilloscope 63 which is connected to computer CPU via line 69, CBLA unit 70 and line 70A. When a pulse is applied, due to ringing and impedance mismatches, there is an overshoot and the pulse causes ringing conditions. Non-ideal matching of electrical components in a transmission line pulse system can introduce reflections and mismatch loss. Losses from reflections are minimized at all port intersections by impedance matching at any port intersection. By matching all components with the characteristic impedance of the transmission line (e.g. 50 Ohms), maximum pulse energy is transferred between ports.

Resistive matching networks (e.g., 2 element L-match or 3 element T-match) are added to the system to improve the matching at port-to-port boundary to minimize reflections losses. When the ringing has subsided, a "measurement window" is defined which allows for a measurement of the voltage within that time window. Preferably, averaging techniques are applied to determine the voltage and current in that time window.

These systems are configured in a number of different ways. In a first configuration, a 500 Ohm impedance 60 is in series with the device DUT. In parallel there is a 48 ohm termination impedance 59B. The current probe CP measures the current through the device DUT and the voltage sensor VP is in parallel with the device DUT. Current is typically limited to 5 Amps. A two-channel oscilloscope 63 is used. There are only minor reflections. No reference pulse is required.

In a second configuration, the reflected pulse is evaluated. In this system, an attenuator is used for re-reflected stress pulses. In this method, the 50 Ohm impedance system is employed. An attenuator (not shown) is recommended which is placed in series with the device DUT in line 58F. The current is typically limited to 10 Amps. A single channel oscilloscope 63 is used. The voltage sensor VP is in parallel with the device DUT. There are multiple reflections. A reference pulse is required if the reflected pulse overlaps the incident pulse, i.e. the one sent in.

In a transmission-based system, there is no attenuation. This method employs a 50 Ohm impedance system. No attenuator is placed in series with the device DUT. The current is typically limited to 10 Amps. A single channel oscilloscope 63 is used. Again the voltage sensor VP is in parallel with device DUT. There are multiple reflections. A reference pulse is required.

In a reflection-transmission based system, a 100 Ohm impedance system is employed. The current is typically limited to 10 Amps. A two-channel oscilloscope 63 is used. The voltage is sensed in parallel with the device DUT, and termination. There are multiple reflections. A reference pulse is required.

The emitted photons are sensed by the photon detector 72 and each event created by a photon striking the detector is captured by the photon data acquisition (collection) system 74. The DUT voltage and current conditions are cycled and the x, y, and time coordinates for each photon are logged. The measurement is cycled and the data is accumulated within each time bin until the desired level of signal amplitude and signal to noise is achieved. Note that the photon emissions are observed during the complete length of the applied pulse and after the pulse, allowing for evaluation of photon emissions after the pulse event has occured.

As in the case of the voltage and current measurement window process, the photon emissions are stored only within that specific window of time. One method to define the photon emissions within the measurement window time, a time averaged photon density is obtained in time for a given position. When it is of interest to store all the photon emissions during the event, or even a different "photon measurement window", the photon emissions are then stored with the information of the current and voltage of the device in the data acquisition system.

In this method, after the pulse event is over, the switch 58C is open to isolate the device DUT and the transmission line electrical connections 58D, 58E, 58F from the pulse source 58B (e.g. commercial source or transmission line cable source).

A leakage measurement is then taken across the device DUT with a commercial measurement system, such as a parameter analyzer or Leakage Meter LM connected to node 61 and to ground. The measurement of the leakage is connected from LM on line 61B to the CVLA 70 to be stored in the CVLA 70.

In the method in this invention, if the evaluation of the leakage exceeds a leakage failure criterion, testing is discontinued. In this method, if it is of interest to evaluate past a leakage increase, the testing can continue to study beyond a failure criterion that is established.

With this pulse waveform, a pulse train of successive pulses is applied continuously, repeating the charging process, switch closures, application of current to device DUT, and the measurement of the current, voltage and photon emission level information, and leakage. In this method, the average current, voltage and photon emission are collected. Given low photon count signals, the repeated tests allow acquisition of more signals for the photon count and intensity in space. The total or average photon intensity, or peak intensity can be of interest to the user.

After adequate pulses, either single or multiple have been applied to the device DUT, the process can continue by incrementally increasing the charging source or pulse source to increase the charge on the source to increase the applied current at the device DUT. The sequence of measuring voltage, current, photon emission and leakage is then repeated, ad infinitum.

In accordance with this method, the pulse width, rise time, or any other variable of interest is altered.

In the case of increasing the pulse source magnitude, an I-V characteristic plot is shown where the measurement window average voltage and current is plotted on the plot. Additionally, a plot of photon count versus either the measurement window averaged current or voltage is plotted. The photon count is total photon count, average photon count within the voltage/current measurement window, an average or total photon count within another measurement window criterion, or the peak intensity at any point in the 2-D array mapping. Additionally, the leakage measurement is plotted along with the current, voltage, or photon measurements for each successive point. Again this is relevant to the single pulse or the repeated pulse train results. In the case of the pulse train, the leakage measurement is taken after a single pulse or a series of pulses from the pulse train.

Test Method Definition

A high current, programmable pulse source (e.g. HP8114A High Current Pulse source) supplies pulses to transmission line 58D as shown in FIG. 7B is used to establish the pulse train and is integrated with a Picosecond Imaging Circuit Analysis (PICA) tool visualization tool of FIG. 7A. Spectral filters 71A–71C shown in FIGS. 7A/7B are used in combination with the photosensor-array 72 to evaluate the light emissions from breakdown or recombination. Radio Frequency (RF) Direct Current (DC) or Alternating Current (AC) Parametrics are employed.

Spectral estimates of the light emission are evaluated using two different filters, rg780 and a bg39. In the emission process, those photon emissions associated with mid-gap electron hole pair recombination will have a different energy and frequency ($E=h\nu$) compared to those emissions which are from breakdown phenomena in junctions.

Experimental results show that the frequency of the emissions from electron hole pair recombination is very narrow band and at the frequency of $\nu=E_g/2h$ where h is the Planck constant. For latchup it is important to detect low level electron hole pair emissions in the chip substrate to evaluate how the excess minority carriers are distributed and recombining in the substrate.

For breakdown phenomena, and high field hot electron emissions, the spectral density is much broader and at a different spectral energy. Electrons accelerated by an electric field will be accelerated until it undergoes an electron-phonon or electron-lattice interaction. As a result, the spectral energy of these is associated with the voltage across a junction region and the applied electric field. As a result, using a filter, which addresses this spectral regime, the high field emissions is observed.

By combining the photon mappings of the electron-hole pair recombination, and the accelerated electron relaxation mapping, a full understanding of the response of where recombination physics and high level hot electron injection is occurring in a complex circuit. By evaluation of both photon mappings, the sources of injection and latchup are better evaluated.

The defined pulse widths would vary from 0.1 nanosecond to 1 microsecond time frames depending on the evaluation of ESD, EOS, or latchup. ESD phenomena will require testing of pulse widths from 0.1 nanosecond to 500 nanoseconds and latchup analysis is typically addressed in a 1 microsecond to 100 microseconds time regime. The rise time for ESD events of interest are typically from 100 picoseconds to 10 nanoseconds. The method would utilize these pulse widths for the different problems of interest. From the data of failure, a Wunsch Bell universal curve is established to evaluate power to failure versus the pulse width.

Power Supply Test Method

In this test, the D.C. voltage is applied to the power rail of the chip device DUT. The positive polarity pulse train is established with a sample pulse width, and time between pulses. The photon emissions are observed in time at the low magnitude of the pulses. After a given pulse magnitude, the pulse train is continued until enough photon emissions are observable to visualize the location of the emissions. After adequate data collection, the pulse magnitude is increased allowing for a higher photon signal. This successive step stress is increased until a latchup, electrical overstress, or failure occurs. A sequence of slides is created to produce an animation of the successive regions of photon emission and the chip failure. The animation is produced where it is understood what the magnitude is in time where the ramp voltage versus time is evident to the viewer of the animation to evaluate the voltage or current-to-failure.

Ground Test

In this test, the D.C. voltage is applied to the substrate rail of the chip. The negative pulse train is established with a sample pulse width, and time between pulses. The photon emissions are observed in time at the low magnitude of the pulses. After a given pulse magnitude, the pulse train is continued until enough photon emission are observable to visualize the location of the emissions. After adequate data collection, the pulse magnitude is increased allowing for a higher photon emission visible signal. This successive step stress is increased until a latchup, electrical overstress, or failure occurs. A sequence of slides is created to produce an animation of the successive regions of photon emission and the chip failure. The animation is produced where it is understood what the magnitude is in time where the ramp voltage versus time is evident to the viewer of the animation to evaluate the voltage or current-to-failure.

Input Pin Evaluation

In this test, the D.C. voltage is applied to the VDD, and the substrate rail of the chip. A positive pulse train is established with a sample pulse width, and time between pulses. The photon emissions are observed in time at the low magnitude of the pulses. After a given pulse magnitude, the pulse train is continued until enough photons are observable to visualize the location of the emissions. After adequate data collection, the pulse magnitude is increased allowing for a higher signal. This successive step stress is increased until a latchup, electrical overstress, or failure occurs. A sequence of slides is created to produce an animation of the successive regions of photon emissions and the chip failure. The animation is produced where it is understood what the magnitude is in time where the ramp voltage versus time is evident to the viewer of the animation to evaluate the voltage or current-to-failure.

A second test is then also completed with a negative polarity pulse train. Using the positive and negative pulse trains, the power-to-failure or latchup triggering initiation is evaluated.

ESD Test

For ESD robustness evaluation, a sequence of ESD-like pulses is applied by a source and the photon emission pattern can again be evaluated in time. ESD-like pulses include 1) Transmission Line Pulse (TLP) model; 2) Human body model (HBM); 3) Machine model (MM); 4) Charge Device Model (CDE); and the 5) Cable Discharge Event (CDE) model.

In this case, like the prior case the pulse is applied to the pads, the power supplies and the grounds. For ESD analysis, a positive or negative polarity pulse train is applied to each. In the ESD pulse train, the period has to be such as to allow cooling between successive pulses. The successive pulses are completed at the same current magnitude and the magnitude is increased as adequate photon emission data is available. This test is different from the latchup test since this allows cooling between successive events, has different polarities, and different waveforms. In this test, the response of the photon emissions are monitored and an animation is stored.

RF Power-to-Failure Test

In this test, the RF signal is an oscillatory source applied to the RF signal pins. The VDD and the VSS are stable and powered. The RF Signal is cycled with an increase amplitude is established after adequate photon emission data is collected. As the RF signal increases, at some point the transistors and circuits will fail due to power-to-failure of the circuit is exceeded. This method is important for RF networks, RF receivers, power-amplifiers and other RF circuitry.

Power Bus Evaluation

In this test, a D.C. current is slowly ramped into a chip to evaluate the uniformity of the current through the chip. Regions which show low photon emission are indicative of power bus drops at these higher currents. The D.C. level is increased until power droops lead to chip failure or the distribution is evaluated.

SYSTEM

From the tests, the following system features is established. The system can have a Computer Aided Design (CAD) system to show the mapping of the emissions and identify the circuits associated with the photon emission.

Power to failure is calculated from the photon emission intensity. The design system can identify the emissions with a specific circuit. From that circuit, the voltage and current is evaluated. From this the power-to-failure is evaluated of the specific component in the chip, as well as the level injected at the pad or power rail. Hence the system will provide a direct calculation as well as the visualization capability using the CAD system, and an identification with the element, and then relate the current to the photon emission magnitude.

As the signal is increased, a correlation is established between the input power and the photon emission rate. As a result, a plot and translation curve identifying the photon rate with the current and voltage of the input source can be produced, allowing for calibration between the input power, reflected power, and the emission rate.

Figure 8:
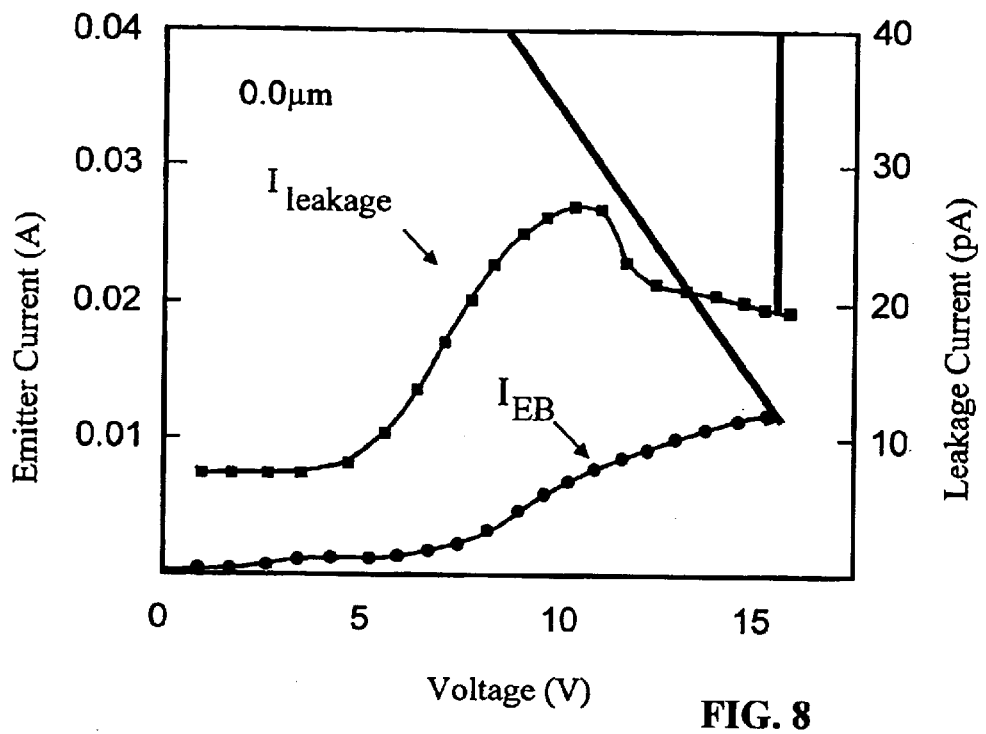
FIG. 8 shows a plot of both Emitter Current ($I_{EB}$) amperes (A) and Leakage Current $I_{leakage}$ (pA) as function of Voltage (V).

FIG. 8 shows a plot of both Emitter Current ($I_{EB}$) amperes (A) and Leakage Current $I_{leakage}$ (pA) as function of Voltage (V) which shows how leakage increases as function of voltage until a peak is reached about 8 V, but decreases as emitter current increases slowly up to about 13 V.

Figure 9A:
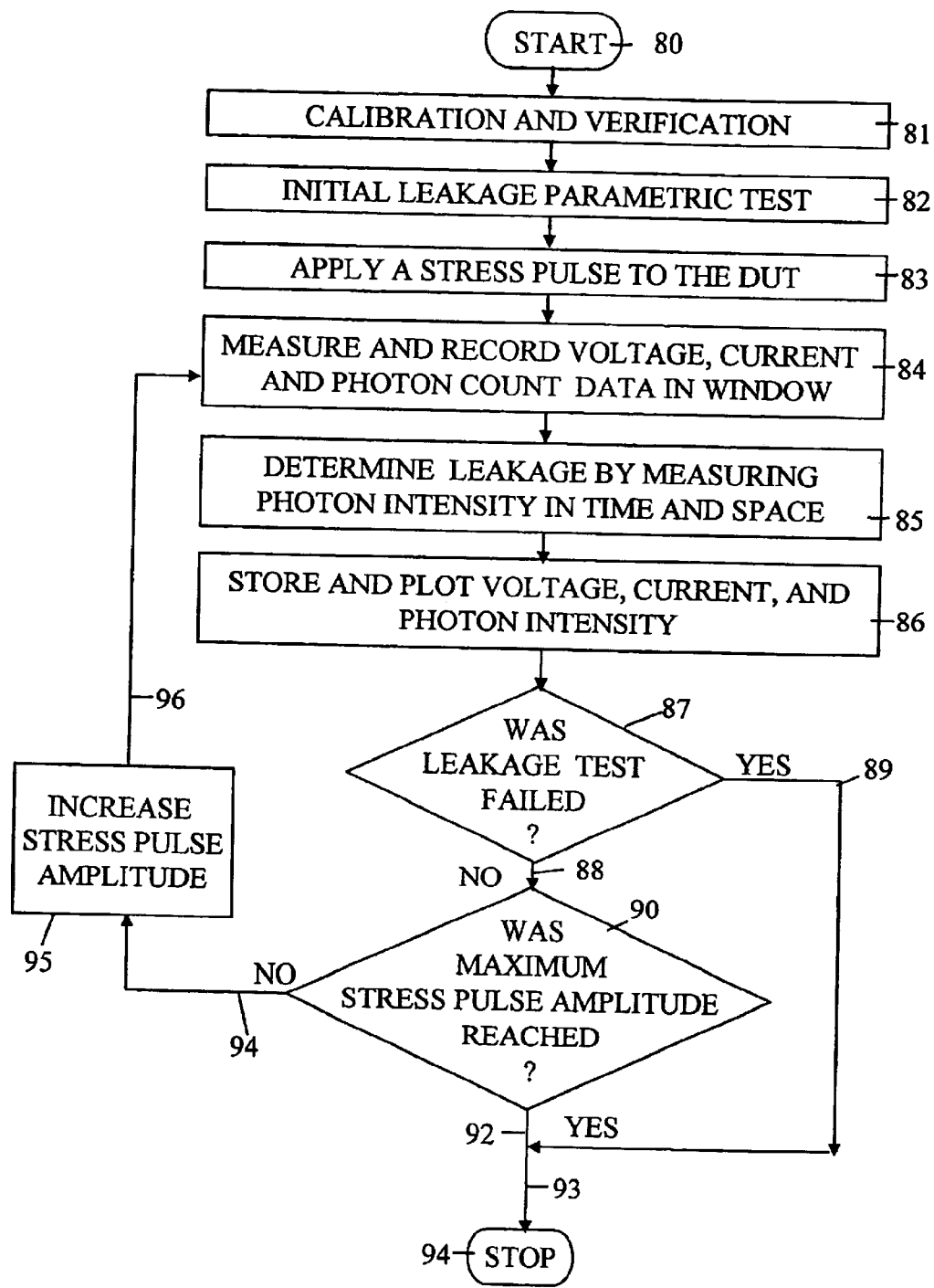
FIG. 9A illustrates a method for testing a device DUT employing the high current pulsed PICA system of FIGS. 7A and 7B.

Referring to FIG. 9A a method is illustrated for testing a device DUT employing the high current pulsed Picosecond Imaging Circuit Analysis system of FIGS. 7A and 7B. The method can consist of the following steps indicated in FIG. 9A starting with step 80.

In step 81, calibrate and verify the test system to extract, i.e. separate, parasitic resistance and impedances from the measurements (e.g. Probe resistance, system resistance). In step 82 perform initial parametric leakage measurement of the device DUT. Then in step 83, apply a stress pulse to the device DUT by closing the switch 58C in FIG. 7A. Next, in step 84, measure (read) and record voltage, current and photon intensity data in the window of the DUT which has been scanned. In step 85 perform a leakage measurement by measuring the photon intensity (count) across the device DUT in time and space by scanning across the device DUT in the measurement window. In step 86, store and/or plot the values of the current (I) voltage (V), photon intensity and leakage. In step 87 the system determines whether the leakage was failed. If the answer is YES that the leakage exceeds a failure criterion, then the process is stopped going directly to step 94 via lines 89 and 93. If the answer to the test was NO, then the system proceeds on line 88 to step 90. In step 90, the system tests to determine whether the maximum pulse amplituded has been reached. If the answer is YES that the leakage exceeds a failure criterion, the system proceeds on lines 92 and 93 to STOP testing in step 94. If NO, the system branches on line 94 to increase the stress pulse amplitude in step 95. Then step 95 leads on line 96 to continue testing with reapplication of a new pulse, by returning recursively to step 84 and the process continues until a YES answer is obtained in test 87 or test 90.

Figure 9B:
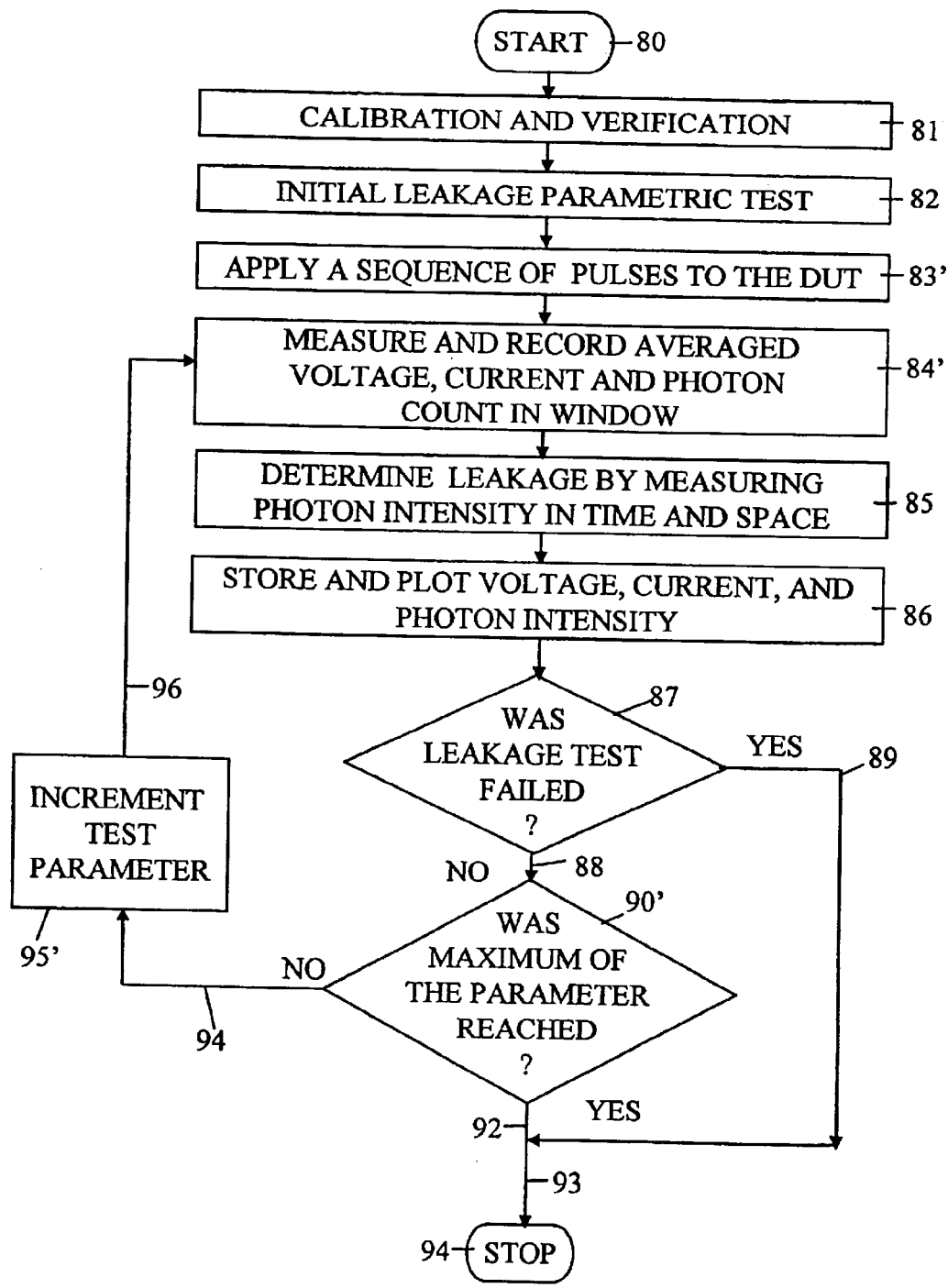
FIG. 9B illustrates an alternative method for testing a DUT by employing the high current pulsed PICA system of FIGS. 7A/7B.

FIG. 9B illustrates an alternative method for testing the device DUT by employing the high current pulsed PICA system of FIGS. 7A and 7B. The steps are the same as in FIG. 9A except for steps 83, 84 and 95 which have been replaced by steps 83', 84' and 95'. In step 83' instead of a single stress pulse, apply a sequence of pulses to the device DUT. In step 84', measure and read current, voltage, and photon count across the device DUT in measurement window and store averaged data for current, voltage, or photon count, or accumulated. In step 95', continue testing with reapplication of a new pulse of different magnitude (or other characteristics . . . eg. Rise time, fall time, etc). In all cases, any type of pulses can be used. The shape of width of the pulse does influence the measurement window process and adjustments need to be made.

This system is operated using an unpowered or powered method. DC chokes are applied to allow for biasing of nodes during pulsing and other means to provide the ac signal on an established dc levels. Adequate isolation would need to be provides for DC isolation during pulsed events.

Types of Pulses

For ESD robustness evaluation, a sequence of ESD-like pulses is applied by a source and the photon emission pattern can again be evaluated in time. ESD-like pulses is 1) Transmission Line Pulse (TLP) model, 2) Human Body Model (HBM), 3) Machine Model (MM), 4) Charge Device Model (CDE) and the 5) Cable Discharge Event (CDE) model. In this case, like the prior case the pulse is applied to the pads, the power supplies and the grounds. For ESD analysis, a positive or negative polarity pulse train is applied to each. In the ESD pulse train, the period has to such to allow cooling between successive pulses. The successive pulses are completed at the same current magnitude and the magnitude is increased as adequate photon emission data is available. This test is different from the latchup test since this allows cooling between successive events, has different polarities, and different waveforms. In this test, the response of the photon emission is monitored and an animation is stored.

Referring now to the drawings, and more particularly to FIG. 7A there is shown a representative environment on which the subject invention can be implemented. FIG. 7A is a diagram illustrating a picosecond imaging circuit analysis tool within which the present invention may be practiced. The high current PICA tool is used in a unique fashion to provide these capabilities.

In this method, the chip is in a powered state. A high current pulse generator which allows increases in the pulse train magnitude with time is used. In this technique, different photon emission energies are sorted using frequency filters to distinguish between recombination and avalanche emissions.

In an electrothermal simulation tool, the post-processor of the emission rates can be based on currents, the mapping of the chip and emulated photo-map of the transient photon emissions. An electrothermal circuit simulation tool can address issues related to the voltage, the current and the temperature at the nodes. The electrothermal simulation calculates the voltages, current and temperature temporally for all elements in the circuit. From this simulation run, the results are post-processed using a post-processing tool which from the results can be determined are as follows:
A) Forward or Reverse Bias State;
B) Photon emission rate and energy spectrum;
C) Diffusion of the carriers and Recombination rates.

From (A) by the potential, it is determined if the structure is in a forward bias or reverse bias.

For (B): For forward bias injection, the carriers are injected into the well or substrate regions. From this the photon emission is associated with the recombination. Recombination of an electron hole pair occurs at the Eg/2h frequency (E=hv) where v is the frequency. For reverse bias generation, knowing the voltage conditions, the electric field is obtained across the junction region. The energy of the emissions is calculated whose energy spectrum is associated with the voltage across the junction, providing a higher frequency component of photon emissions.

(C) From the local temperature obtained from the electrothermal simulation, the temperature is calculated. The temperature is used to determine the mobility and diffusion coefficient (D/u=kT/q) and hence from the solution of the diffusion equation, the number of carriers at a position from the injecting source is calculated. The calculated number (temporally) is used to calculate the net emission of photons whose energy is Eg/2.

Then results are shown on a two dimensional mapping of the physical chip layout and an emulated map is produced in time and space. The intensity level is associated with the number of photons available at that frequency. A second map can be generated with a different frequency filter. Like the actual tool, the emulated tool allows for the emulation of the mapping for different frequencies or ranges of frequencies. From the tests, the following system features are established. The system can have a computer aided design (CAD) system to show the mapping of the emissions and identify the circuits associated with the photon emissions.

Power to failure is calculated from the photon emission intensity. The design system can identify the emissions with a specific circuit. From that circuit, the voltage and current are evaluated. From this evaluation, the power-to-failure is evaluated for the specific component in the chip, as well as the level injected at the pad or power rail. Hence the system will provide a direct calculation as well as the visualization capability using the CAD system, and an identification with the element, and will then relate the current to the photon emission magnitude.

As the signal current is increased, a correlation is established between the input power and the photon emission rate. As a result, a plot and translation curve identifying the photon rate with the current and voltage of the input source, allowing for calibration between the input power, reflected power, and the emission rate.

Figure 10:
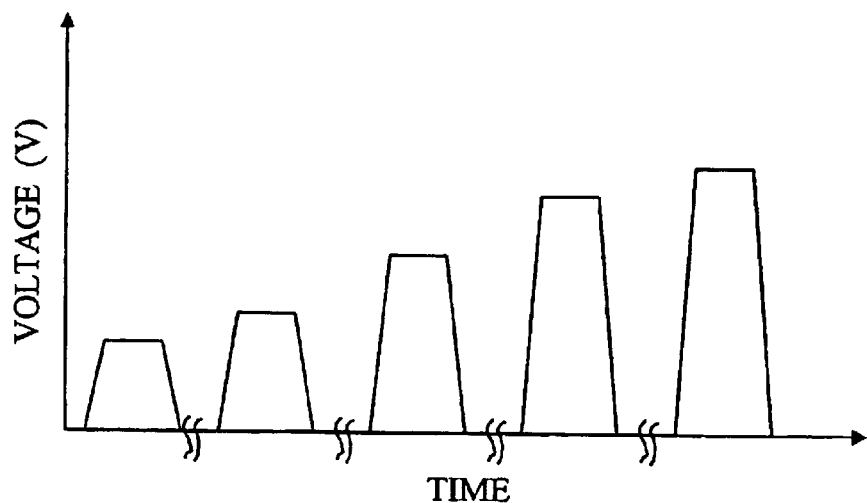
FIG. 10 shows a plot of PICA test pulses with voltages having amplitudes which increase as a function of time in accordance with another aspect of this invention.

FIG. 10 shows a plot of PICA test pulses with voltages having amplitudes which increase as a function of time in accordance with another aspect of this invention.

Figures 11A, 11B:
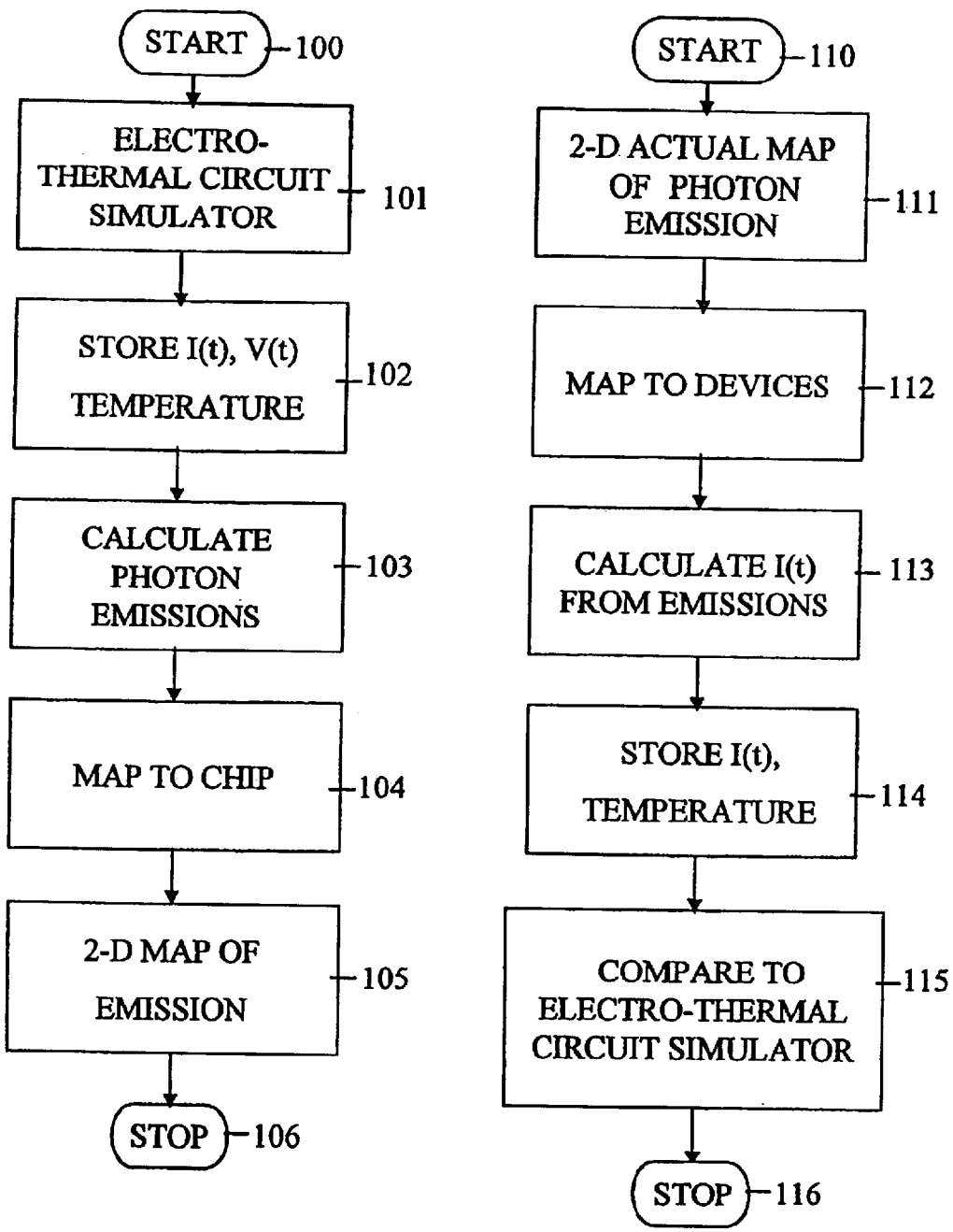
FIGS. 11A and 11B are provided for comparison of two photon induced current mappings of a chip design.

An electrothermal simulation tool can include a postprocessor which provides emission rates based on currents, the mapping of the chip and emulated photo-map of the transient photon emissions and the actual mapping produced by the picosecond imaging circuit analysis. Hence, the emulated picosecond imaging circuit analysis map is compared to the actual map. A comparative process is creates where the two maps are placed side-by-side in time and space and for a given photon frequency using the real filters and the emulated filters from the calculations. By placing the two maps adjacent to each other, unanticipated events are analyzed. These events include as follows:

1) Device Failure
2) Unanticipated transients
3) Design faults
4) Interconnect failure
5) MOSFET failure
6) ESD event failure
7) Electromigration failures FIGS. 11A and 11 B are provided for comparison of two photon emission mappings of a chip design. An emulated map is made of what a tool would yield. By data overlaying, the two maps are overlayed where a differential map is initiated to determine the differences between the emulated and the actual. In this way, the difference is highlighted to determine failures, faults and events more clear to the viewer. A smart system is developed to identify the nature of the differential photon emissions. In addition, the mappings of different frequencies are compared (emulated versus actual). In that fashion, the forward or reverse bias differential distinction is identified.

In FIG. 11A, the process starts with step 100. In step 101, an electrothermal simulator is employed to simulate a circuit. In step 102, the simulated values of current and voltage are recorded as a function of temperature. In step 103, the quantity of photon emissions from the device DUT is calculated by the system. In step 104, the values calculated are mapped to the device DUT which may be an integrated circuit chip. In step 105, a two dimensional map of the emission patterns obtained in step 104 is created and then the process stops in step 106.

FIG. 11B is a flow chart which shows a reverse method using the actual photon emissions to calculate the current density and identifying the element, and then calculating the currents and voltages at those nodes in the circuit. This process is reversed where the actual photon induced current map is used to identify the voltage and current of nodes in the physical circuit. From the actual photon map, the steps are completed as described next.

In FIG. 11B, the process starts with step 110. In step 111, a two dimensional actual map of the photon emission patterns obtained is created. In step 112, the values calculated are mapped to the device DUT which may be an integrated circuit chip. In step 113, use the system to calculate I(t) from photon emissions from the device(s) DUT. In step 114, the system stores I(t), i.e. current as a function of temperature. In step 115, compare the results to those obtained from the electro-thermal simulator employed in FIG. 11A. Then the process stops in step 116.

A) A photon emission map is created from measurement;
B) The emissions are associated with specific nodes;
C) The currents at that node are calculated; and
D) Temperature is estimated based on the total current (temperature is associated with Joule heating and I2R).
E) Calculated currents are compared to the electrothermal simulation circuit simulation results. Calculated temperature is compared to electrothermal simulation predicted temperature, and calculated current is compared to the electrothermal circuit currents.

Figure 12:
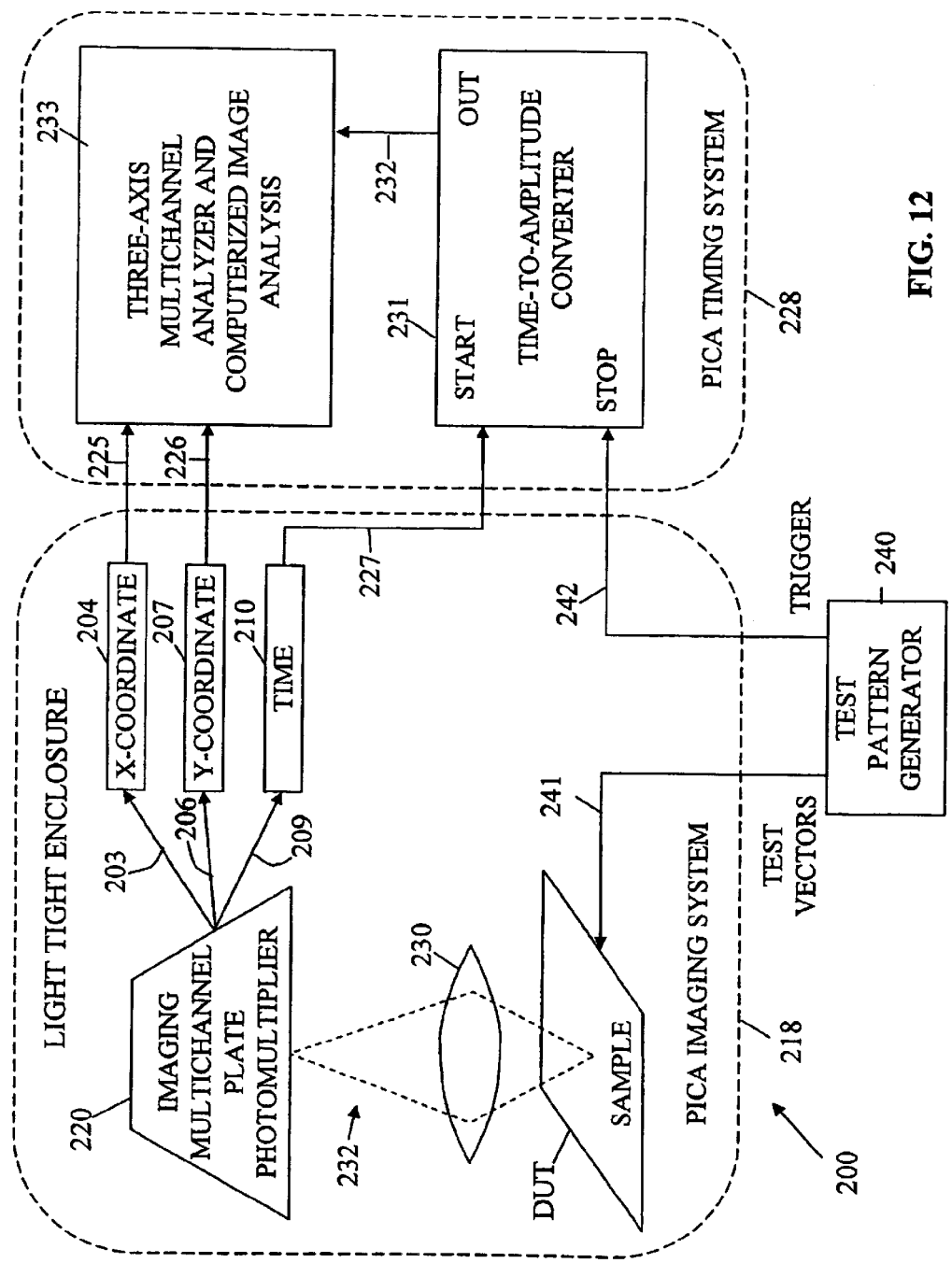
FIG. 12 shows another pulsed PICA tool to which a Transmission Line Pulse (TLP) is supplied in a representative environment on which the subject invention may be may be practiced on a Device Under Test (DUT) in accordance with the present invention.

FIG. 12 shows another pulsed PICA system in accordance with this invention. In FIG. 12 a sample DUT is shown with detection being provided by electromagnetic (optical, etc.) radiation 232 being focussed by a lens 230 upon an imaging multichannel plate photomultiplier 220 which has an output 203 to the x-coordinate block 204, line 206 to the y-coordinate block 206 and line 209 to the time block 210. The x-coordinate block 204 which delivers x-position data output on line 225, and the y-coordinate block 206 which delivers y-position data output on line 26 are connected to provide x/y inputs to the three-axis multichannel analyzer and computerized image analysis block 233. The time block 210 supplies time data on line 227 to the START input to the Time-to-Amplitude Converter (TAC) in the PICA timing system 228. A test pattern generator 240 supplies control signals on cable 241 to the stage on which the sample DUT is supported; and supplies trigger signals on line 242 to the STOP input of the TAC 231. The time signal on line 227 passes to the START input of the TAC 31. The TAC 231 provides an output on line 232 to the three-axis multichannel analyzer and computerized image analysis block 233.

As in the case of the voltage and current measurement window process, the photon emissions are stored only within that specific window of time. One method to define the photon emissions within the measurement window time, a time averaged photon density is obtained in time for a given position. When it is of interest to store all the photon emissions during the event, or even a different "photon measurement window", the photon emissions are then stored with the information of the current and voltage of the device in the data acquisition system.

While this invention has been described in terms of the above specific embodiment(s), those skilled in the art will recognize that the invention is practiced with modifications within the spirit and scope of the appended claims, i.e. that changes is made in form and detail, without departing from the spirit and scope of the invention as described and claimed. Accordingly all such changes come within the purview of the present invention and the invention encompasses the subject matter of the claims which follow. Various aspects of the embodiments described above may be combined and/or modified.

We claim:

1. A method for operating a Picosecond Imaging Circuit Analysis (PICA)/high current source system comprising:

applying pulses from a high current pulse source to an unpowered Device Under Test (DUT);

employing a photosensor means for detecting photon emissions from said DUT;

receiving signals from said photosensor means to map photon emissions from said DUT; and employing data processing means for relating said photon emissions to specific features of said DUT.

2. A method for operating a Picosecond Imaging Circuit Analysis (PICA)/high current source system comprising:

applying pulses from a high current pulse source to a Device Under Test (DUT);

employing a photosensor means for detecting photon emissions from said DUT;

receiving signals from said photosensor means to map photon emissions from said DUT;

employing data processing means for relating said photon emissions to specific features of said DUT; and including high current source means for generating a pulse train which increases in amplitude with time.

3. The method of claim 2, wherein said pulse train is periodic or aperiodic.

4. The method of claim 3, wherein where said pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged cable Discharge Event (CDE), and a Transmission Line Pulse (TLP).

5. A method for operating a Picosecond Imaging Circuit Analysis (PICA)/high current source system comprising:

applying pulses from a high current pulse source to a Device Under Test (DUT);

employing a photosensor means for detecting photon emissions from said DUT;

receiving signals from said photosensor means to map photon emissions from said DUT;

employing data processing means for relating said photon emissions to specific features of said DUT;

providing a current probe to measure current in said DUT;

providing a voltage probe to measure voltage in said DUT;

providing a leakage measurement means for evaluation of a device;

providing a photon signal collection process in time from said device;

providing a step increase in the high current pulse source amplitude after adequate emission data is established;

providing a Computer Aided Design (CAD) system to visualize the emissions on the chip mapping;

providing a means to store voltage, current, leakage and photon emissions from said device;

providing an averaging means of voltage, current, leakage, and photon measure;

providing a means of visualization of a photon intensity spatially;

providing a means to plot voltage, current, leakage an a measure of photon emissions from said device; and whereby high current pulse and picosecond imaging circuit analysis is provided.

6. A method for evaluation of photon emissions and high current robustness of a semiconductor chip comprising the steps as follows:

providing electrical signals to pads of said semiconductor chip;

eliminating power supply D.C. voltage levels to said chip to set said chip into an unpowered state;

providing a pulse train source producing pulses with a fixed pulse width and fixed rise and fall times for a pre-determined pulse current magnitude into said pads of said semiconductor chip;

providing filtered light emissions by filtering light emissions of a first frequency range from said semiconductor chip;

collecting said filtered light emissions and determining an adequate number of pulses to provide adequate signal magnitude for analysis;

evaluating functionality of said semiconductor chip to evaluate parametric shifts or destruction;

increasing said current magnitude of said pulse train and repeating aforementioned steps until destruction of said semiconductor chip; and repeating all the above steps with a second filter frequency range.

7. The method of claim 6 wherein said pulse train source provides pulses with a plurality of pulse widths.

8. The method of claim 6 wherein said pulse train source provides pulses with a plurality of pulse rise times.

9. The method of claim 6 wherein a filter is used to determine electron-hole pair recombination.

10. The method of claim 9 wherein said filter is used to determine avalanche breakdown.

11. The method of claim 9 wherein said filters are rg780 and bg39.

12. A method of providing a picosecond imaging circuit analysis/ high current source system and emulator comprising the steps as follows:

providing a high current pulse source;

providing a photon signal collection process in time;

providing a step increase in the high current pulse source amplitude after adequate emission data is established;

providing a Computer Aided Design (CAD) system to visualize the emissions on the chip mapping;

providing an electrothermal circuit simulation;

providing a post-processor to generate the photon emission rate;

providing a emulated mapping of said photon collection process in time; and providing a comparator between said actual photon mapping and said emulated photon mapping.

13. A computer program product comprising a computer useable medium having computer readable program code embodied therein for operating a picosecond imaging circuit analysis/high current source system, the program product comprising:

a) program code configured to provide a high current pulse source;

b) program code configured to employ a photosensor means for detecting photon emissions from an onpowered device under test (DUT);

c) program code configured for receiving signals from said photosensor means to map photon emissions from said DUT; and d) program code configured for employing data processing means for relating said photon emissions to specific features of said DUT.

14. A computer program product comprising a computer useable medium having computer readable program code embodied therein for operating a picosecond imaging circuit analysis/high current source system, the program product comprising:

a) program code configured to provide a high current pulse source;

b) program code configured to employ a photosensor means for detecting photon emissions from a device under test;

c) program code configured for receiving signals from said photosensor means to map photon emissions from said DUT;

d) program code configured for employing data processing means for relating said photon emissions to specific features of said DUT; and e) program codes configured to operate high current source means for generating a pulse train which increases in amplitude with time.

15. The computer program product of claim 14 including program codes configured to said pulse train are periodic or aperiodic.

16. The computer program product of claim 15 including program code configured whereby said pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged eable Discharge Event (CDE), and a Transmission Line Pulse (TLP).

17. A picosecond imaging circuit analysis/high current source analysis apparatus comprising:

a high current source means for applying a pulse to an unpowered Device Under Test (DUT);

photosensor means for detecting photon emissions from a DUT;

a data acquisition circuit for receiving signals from said photosensor means for mapping of photon emissions from said DUT; and data processing means connected to said data acquisition circuit for relating said photon emissions to specific features of said DUT.

18. A picosecond imaging circuit analysis/high current source analysis apparatus comprising:

a high current source means for applying a pulse to a Device Under Test (DUT);

photosensor means for detecting photon emissions from a DUT;

a data acquisition circuit for receiving signals from said photosensor means for mapping of photon emissions from said DUT; and data processing means connected to said data acquisition circuit for relating said photon emissions to specific features of said DUT.

19. The apparatus of claim 18, wherein said pulse train is periodic or aperiodic.

20. The apparatus of claim 19 wherein where said pulse train is an ElectroStatic Discharge (ESD) event selected from the group consisting of a Human Body Model (HBM), a Machine Model (MM), a Charged Device Model (CDM), a Reverse Charge Device Model (RCDM), a Socketed Device Model (SDM), a Charged cable Discharge Event (CDE), and a Transmission Line Pulse (TLP).

21. The apparatus of claim 18, wherein an algorithm is provided to relate said photon emission to said power to failure.

22. A high current pulse electrical and picosecond imaging circuit analysis comprising:

a pulse source;

a transmission line cable from the said pulse source to a structure with a high voltage switch connected in said transmission line cable;

an oscilloscope;

a current probe;

a voltage probe;

a leakage measurement source;

photo-detector array;

a data-acquisition system connected for collecting data from the imaging detector and data including oscilloscope voltage and current signals, leakage measurements; and means for providing visualization of photon emissions in time.

23. An apparatus to emulate a picosecond imaging circuit analysis/high current source analysis apparatus comprising:

a high current source forming a pulse train;

a collection source for evaluating photon emissions;

a computer aided design (CAD) system for visualizing chip mapping;

an electrothermal circuit simulator;

a post-processing system for calculating photon emission from a circuit simulator; and a second computer aided design (CAD) system for visualizing emulated photon emissions from said post-processing system.

24. The apparatus of claim 23 wherein said system provides a filter for emission energy for said first and said second CAD systems.

25. The apparatus of claim 23 wherein a comparator system compares an actual photon emission map from said first computer aided design (CAD) system from the photon emissions, and from said second computer aided design (CAD) system from an emulated photon emission map.

26. The apparatus of claim 25 wherein said system provides a filter for emission energy for said first and said second CAD systems.

27. The apparatus of claim 23 wherein a third CAD system provides the means to calculate current and voltage on a given node from said photon emission mapping whose results are compared to said electrothermal circuit simulation results.

28. A method for operating a Picosecond Imaging Circuit Analysis (PICA)/high current source system comprising:

applying pulses from a high current pulse source to a powered Device Under Test (DUT);

employing a photosensor means for detecting photon emissions from said DUT;

receiving signals from said photosensor means to map photon emissions from said DUT; and employing data processing means for relating said photon emissions to specific features of said DUT.

29. A picosecond imaging circuit analysis/high current source analysis apparatus comprising:

a high current source means for applying a pulse to a powered Device Under Test (DUT);

photosensor means for detecting photon emissions from a DUT;

a data acquisition circuit for receiving signals from said photosensor means for mapping of photon emissions from said DUT; and data processing means connected to said data acquisition circuit for relating said photon emissions to specific features of said DUT.

30. A computer program product comprising a computer useable medium having computer readable program code embodied therein for operating a picosecond imaging circuit analysis/high current source system, the program product comprising:

a) program code configured to provide a high current pulse source;

b) program code configured to employ a photosensor means for detecting photon emissions from a powered device under test (DUT);

c) program code configured for receiving signals from said photosensor means to map photon emissions from said DUT; and d) program code configured for employing data processing means for relating said photon emissions to specific features of said DUT.

* * * * *

UNITED STATES PATENT AND TRADEMARK OFFICE
CERTIFICATE OF CORRECTION

PATENT NO. : 6,943,578 B1
DATED : September 13, 2005
INVENTOR(S) : Sanda et al.

It is certified that error appears in the above-identified patent and that said Letters Patent is hereby corrected as shown below:

Title page,
Item [56], References Cited, OTHER PUBLICATIONS, add
-- Takahiro et al. "Analysis of Latchup-Induced Photoemission", IEDM 89 pp 281-184/11.2.1-11.2.4 (1989 IEEE) --.

Column 3,
Lines 47-48, delete "emission" and insert -- emissions --.

Column 4,
Line 28, delete "emission" and insert -- emissions --.
Line 55, delete "on" and insert -- of --.

Column 6,
Line 37, delete "a" and insert -- of --.

Column 7,
Line 51, delete "may be may be" and insert -- may be --.

Column 12,
Lines 5-6, delete "analysing" and insert -- analysis --.

Column 14,
Lines 4 and 14, delete "emission" and insert -- emissions --.

UNITED STATES PATENT AND TRADEMARK OFFICE
CERTIFICATE OF CORRECTION

PATENT NO. : 6,943,578 B1
DATED : September 13, 2005
INVENTOR(S) : Sanda et al.

It is certified that error appears in the above-identified patent and that said Letters Patent is hereby corrected as shown below:

Column 20,
Line 35, delete "TAC 31" and insert -- TAC 231 --.

Column 22,
Lines 52-53, delete "onpowered" and insert -- unpowered --.

Column 23,
Line 22, delete "eable" and insert -- cable --.
Line 49, delete "." and insert -- , wherein said high current source means generates a pulse train which increases in amplitude with time. --.

Signed and Sealed this

Twenty-seventh Day of December, 2005

JON W. DUDAS
*Director of the United States Patent and Trademark Office*